(12) United States Patent
Kaneko et al.

(10) Patent No.: US 10,748,746 B2
(45) Date of Patent: Aug. 18, 2020

(54) MICROWAVE OUTPUT DEVICE AND PLASMA PROCESSING APPARATUS

(71) Applicant: Tokyo Electron Limited, Tokyo (JP)

(72) Inventors: Kazushi Kaneko, Miyagi (JP); Yukinori Hanada, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/396,831

(22) Filed: Apr. 29, 2019

(65) Prior Publication Data
US 2019/0341228 A1 Nov. 7, 2019

(30) Foreign Application Priority Data

May 1, 2018 (JP) ................................. 2018-088213

(51) Int. Cl.
*H01J 37/32* (2006.01)
*H05H 1/46* (2006.01)

(52) U.S. Cl.
CPC ......... *H01J 37/32229* (2013.01); *H05H 1/46* (2013.01); *H05H 2001/4622* (2013.01)

(58) Field of Classification Search
CPC .......... H01J 37/32229; H01J 37/32192; H01J 37/32211; H01J 37/32266; H01J 37/32302; H01J 37/32311; H01J 37/32935; H01J 37/3299; H05H 1/46; H05H 2001/4622; C23C 14/22; C23C 16/511; G01R 23/02; G06F 7/602; H01L 21/3065; H01L 22/26; H03F 3/2171; H03F 3/24; H03F 3/245; H03L 7/0816; H03L 7/1976; H03M 3/02; H03M 3/37; H03M 3/502; H03M 7/3011; H03M 7/3015; H03M 7/304; H04B 14/062; H04L 27/36; H05B 6/062; H05B 6/681; H05B 6/70; H05B 6/705; H05B 6/72
See application file for complete search history.

(56) References Cited

U.S. PATENT DOCUMENTS 9,761,419 B2 * 9/2017 Nagami ............ H01J 37/32715
9,837,285 B2 * 12/2017 Tomura ............ H01L 21/76897
(Continued)

FOREIGN PATENT DOCUMENTS

JP H06-267900 A 9/1994
JP 2012-109080 A 6/2012

*Primary Examiner* — Renan Luque
(74) *Attorney, Agent, or Firm* — Studebaker & Brackett PC

(57) ABSTRACT

A microwave output device include: a microwave generation unit configured to generate a microwave, power of the microwave being pulse-modulated such that a pulse frequency, a duty ratio, a high level, and a low level respectively corresponding to a setting pulse frequency, a setting duty ratio, high level setting power, and low level setting power given from a controller; and an output unit configured to output a microwave propagating from the microwave generation unit, wherein the microwave generation unit alternately generates a microwave having a center frequency and a bandwidth respectively corresponding to a setting frequency and a setting bandwidth given from the controller and a microwave having a single frequency peak at a center frequency corresponding to a setting frequency given from the controller, in synchronization with switching between a high level and a low level of the power.

20 Claims, 22 Drawing Sheets

(56) References Cited

U.S. PATENT DOCUMENTS

| | | | |
|---|---|---|---|
| 2004/0178859 A1* | 9/2004 | Fontaine | H03C 3/0925 331/170 |
| 2015/0170886 A1* | 6/2015 | Morimoto | H01J 37/32128 156/345.24 |
| 2017/0345664 A1* | 11/2017 | Kubota | H05H 1/46 |
| 2019/0057843 A1* | 2/2019 | Kaneko | H03L 5/02 |

* cited by examiner

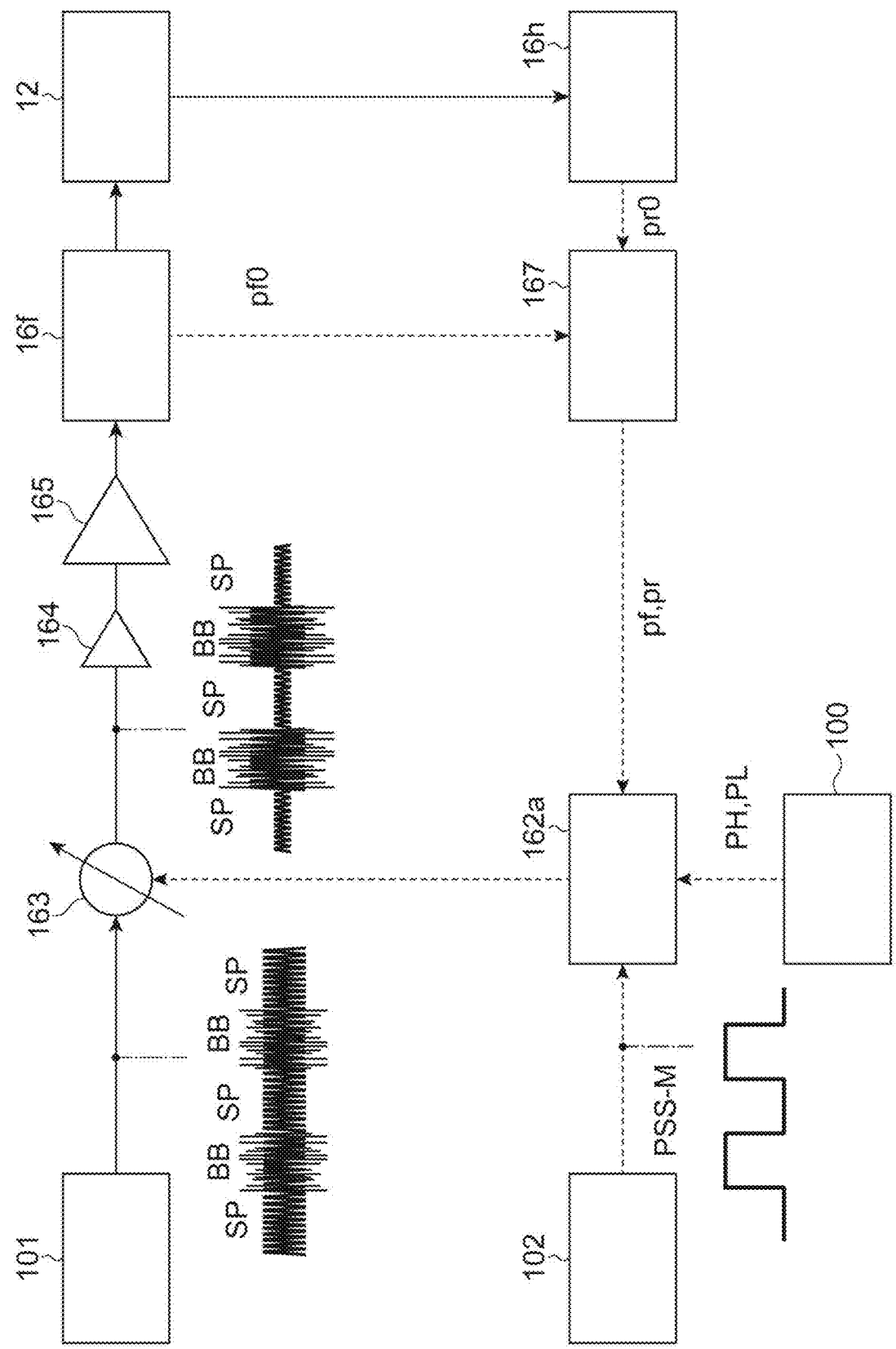

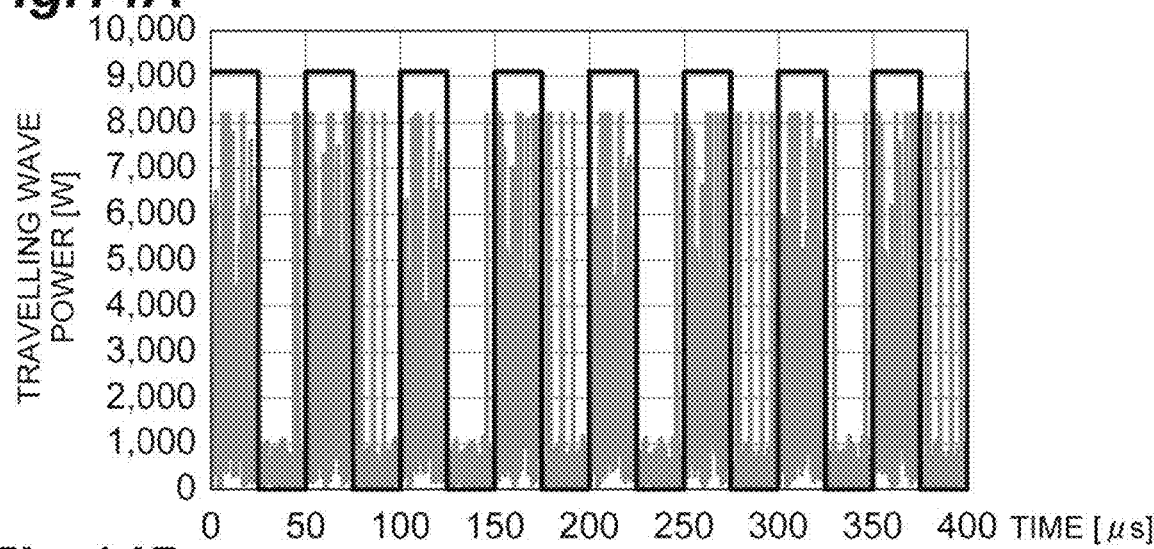
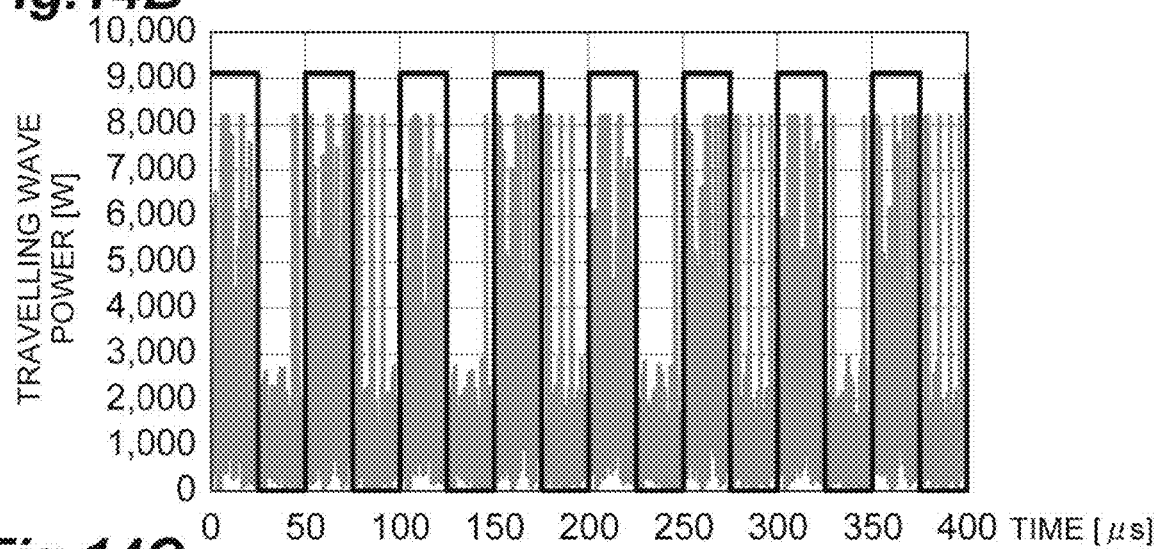
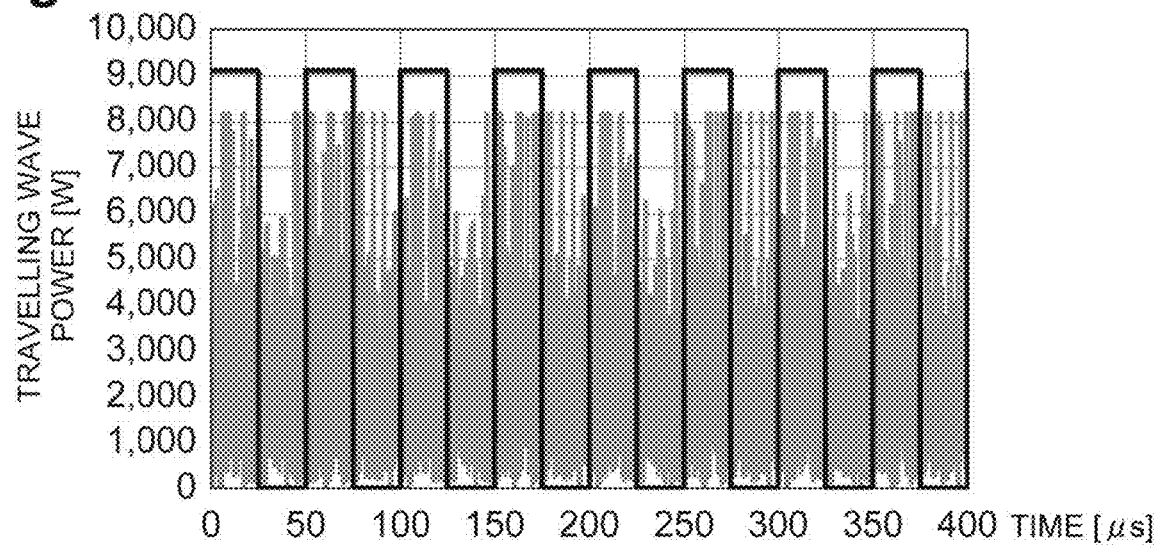

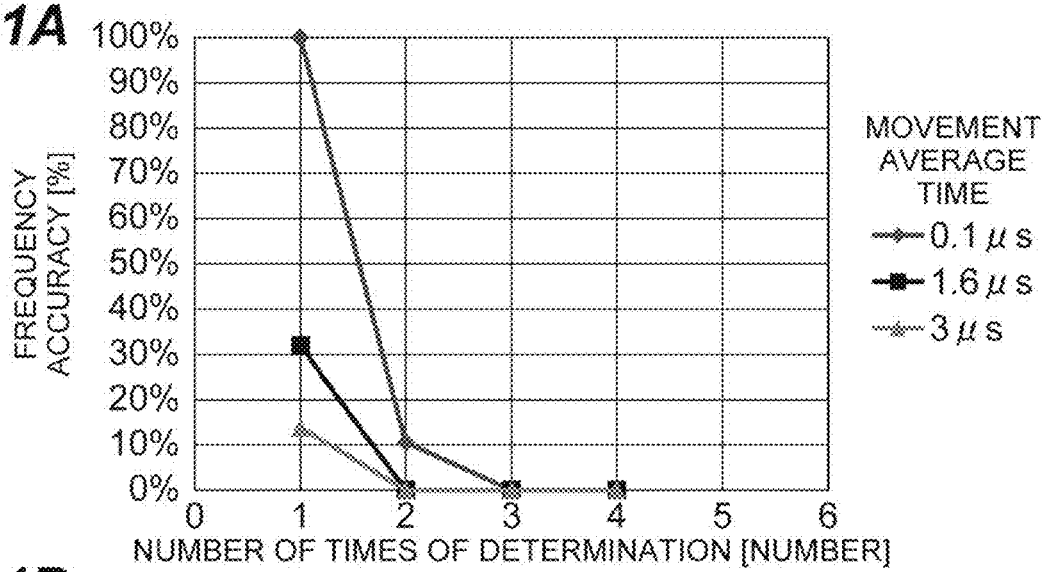
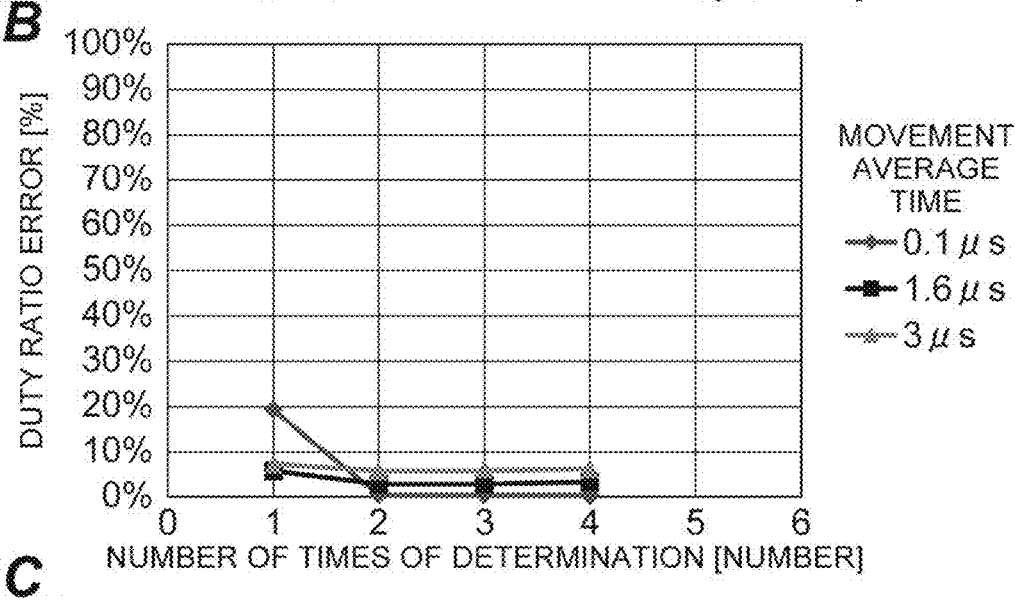
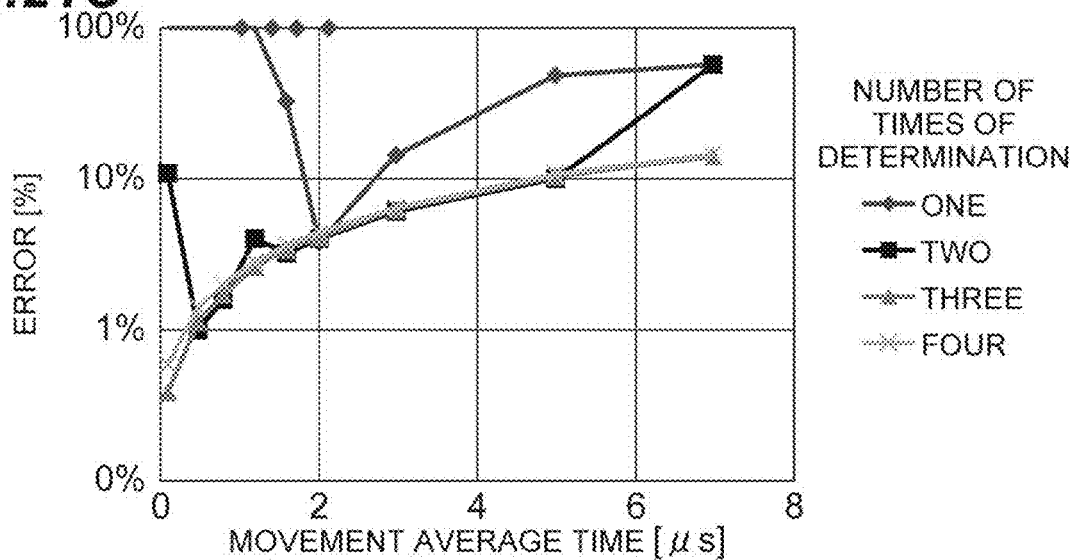

MICROWAVE OUTPUT DEVICE AND PLASMA PROCESSING APPARATUS

CROSS-REFERENCE TO RELATED APPLICATIONS

This application is based on and claims the benefit of priority from Japanese Patent Application No. 2018-088213 filed on May 1, 2018, and the entire contents of which are incorporated herein by reference.

TECHNICAL FIELD

The present disclosure relates to a microwave output device and a plasma processing apparatus.

BACKGROUND

A plasma processing apparatus is used to manufacture an electronic device such as a semiconductor device. The plasma processing apparatus includes various types of apparatuses such as a capacitive coupling type plasma processing apparatus and an inductive coupling type plasma processing apparatus. In recent years, a plasma processing apparatus of a type of exciting a gas by using microwaves has been used.

Japanese Unexamined Patent Publication No. 2012-109080 discloses a plasma processing apparatus using microwaves. The plasma processing apparatus includes a microwave output device outputting a microwave having a bandwidth. The apparatus can stabilize plasma by outputting the microwave having a bandwidth.

Japanese Unexamined Patent Publication No. H6-267900 discloses an apparatus which pulse-modulates a microwave for exciting plasma. This apparatus can prevent instability of plasma so as to reduce an electron temperature and an ion temperature.

SUMMARY

In an aspect, there is provided a microwave output device. The microwave output device includes a microwave generation unit and an output unit. The microwave generation unit generates a microwave of which power is pulse-modulated such that a pulse frequency, a duty ratio, a high level, and a low level respectively corresponding to a setting pulse frequency, a setting duty ratio, high level setting power, and low level setting power given from a controller. The output unit outputs a microwave propagating from the microwave generation unit. The microwave generation unit alternately generates a microwave having a center frequency and a bandwidth respectively corresponding to a setting frequency and a setting bandwidth for which instructions are given from the controller and a microwave having a single frequency peak at a center frequency corresponding to a setting frequency for which an instruction is given from the controller, in synchronization with switching between a high level and a low level of the power.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIG. 6 is a diagram illustrating an example of a configuration related to control of power of a microwave.

FIGS. 14A to 14C are graphs illustrating results of simulating a relationship between traveling wave power and time every low power in Comparative Example 2 (a microwave having a broadband frequency).

FIGS. 21A to 21C are graphs illustrating results of simulating pulse monitor accuracy in Example 5 (a microwave alternately having a broadband frequency and a single frequency peak).

DETAILED DESCRIPTION

Figure 1:
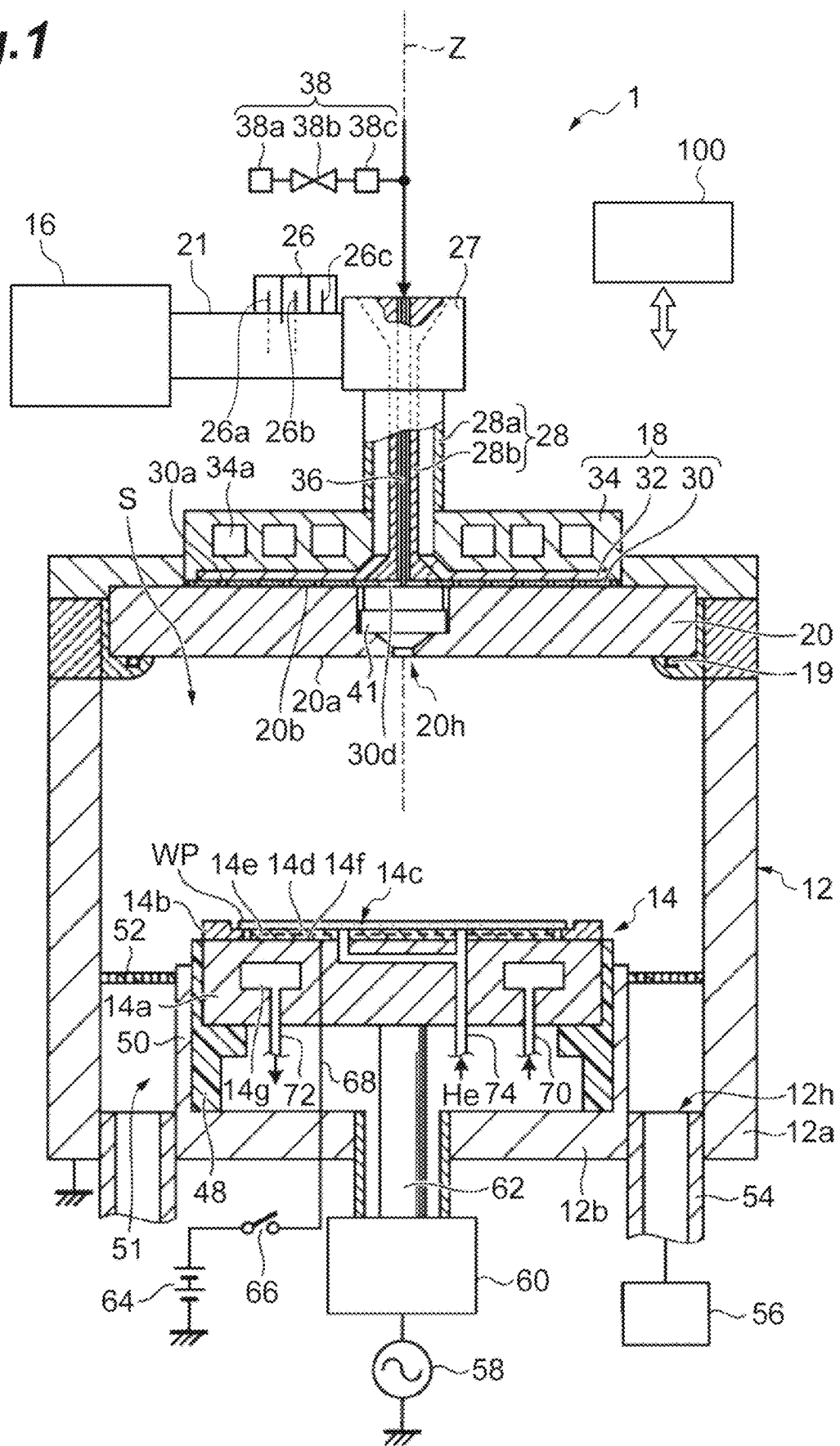
FIG. 1 is a diagram illustrating an example of a plasma processing apparatus according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In an electronic device manufacturing field, achievement of low power of a microwave progresses in order to further reduce damage to an object to be processed. However, if power of a microwave is too low, there is concern that plasma may become unstable or a misfire may occur. In other words, there is a limitation in an approach to achievement of low power. As a separate approach, an electron temperature of plasma may be further reduced.

Power of a microwave may be pulse-modulated as in the apparatus disclosed in Japanese Unexamined Patent Publication No. H6-267900 by employing a microwave having a bandwidth as in the apparatus disclosed in Japanese Unexamined Patent Publication No. 2012-109080. In order to more stably maintain plasma, low level power subjected to pulse modulation may be set to power sufficient to excite plasma. In such pulse modulation, it is necessary to check that power of a travelling wave output from the microwave output device is pulse-modulated.

The present disclosure provides a technique for outputting a microwave allowing a pulse frequency and a duty ratio of a pulse-modulated microwave to be easily monitored.

According to an aspect, there is provided a microwave output device. The microwave output device includes a microwave generation unit and an output unit. The microwave generation unit generates a microwave of which power is pulse-modulated such that a pulse frequency, a duty ratio, a high level, and a low level respectively corresponding to a setting pulse frequency, a setting duty ratio, high level setting power, and low level setting power for which instructions are given from a controller are obtained. The output unit outputs a microwave propagating from the microwave generation unit. The microwave generation unit alternately generates a microwave having a center frequency and a bandwidth respectively corresponding to a setting frequency and a setting bandwidth for which instructions are given from the controller and a microwave having a single frequency peak at a center frequency corresponding to a setting frequency for which an instruction is given from the controller, in synchronization with switching between a high level and a low level of the power.

The microwave output device alternately outputs a microwave having a bandwidth and a microwave having a single frequency peak in synchronization with a high level and a low level. The microwave having a bandwidth has a waveform which temporally rises and falls, and the microwave having a single frequency peak has a waveform which does not temporally greatly rise and fall. Thus, the microwave output device enables a boundary between a high level power section and a low level power section to be easily understood compared with a case where a microwave having a bandwidth is pulse-modulated. Therefore, the microwave output device can output a microwave allowing a pulse frequency and a duty ratio of a pulse-modulated microwave to be easily monitored.

In an exemplary embodiment, the microwave generation unit may alternately generate a microwave having a center frequency and a bandwidth and a microwave having a single frequency peak at the center frequency in synchronization with switching between a high level and a low level of the power in a case where the low level setting power is higher than threshold power, and may generate a microwave having a center frequency and a bandwidth and being pulse-modulated in a case where the low level setting power is equal to or lower than the threshold power.

In this case, the microwave output device has two output modes. In a first output mode, a microwave having a bandwidth and a microwave having a single frequency peak are alternately output in synchronization with switching between a high level and a low level. In a second output mode, switching between a microwave having a bandwidth and a microwave having a single frequency peak is not performed, and power of only the microwave having a bandwidth is pulse-modulated and is output. As mentioned above, the microwave output device can perform switching between the output modes according to low level setting power.

In an exemplary embodiment, the low level setting power may be 0 W. In a case where low level power is higher than 0 W, a set pulse is a high/low pulse having power in a low level. In a case where the low level power is 0 W, a set pulse is an ON/OFF pulse which is 0 W other than the time at which the pulse is in an ON state. In a case of the ON/OFF pulse, a waveform does not appear in an OFF section, and thus a boundary between an ON section and an OFF section is easily recognized. Thus, in a case where pulse modulation based on an ON/OFF pulse is performed, the microwave output device can stabilize plasma by using a microwave having a bandwidth in all sections. In a case where pulse modulation based on a high/low pulse is performed, the microwave output device can make stabilization of plasma and easy monitoring of a microwave compatible by performing switching to a microwave having a single frequency peak in either a high section or a low section.

In an exemplary embodiment, the microwave generation unit may generate a waveform of a microwave in which a first waveform having a center frequency and a bandwidth respectively corresponding to a setting frequency and a setting bandwidth for which instructions are given from the controller and a second waveform having a single frequency peak at a center frequency corresponding to a setting frequency for which an instruction is given from the controller alternately appear, on the basis of a pulse synchronization signal, and may control power of the first waveform and power of the second waveform on the basis of the generated waveform of the microwave, the pulse synchronization signal, and setting power corresponding to each of the first waveform and the second waveform.

In this case, the microwave output device can generate a waveform of a microwave in which the first waveform and the second waveform alternately appear on the basis of the pulse synchronization signal, and can perform power control for each waveform on the basis of the pulse synchronization signal.

In an exemplary embodiment, the microwave output device may further include a first directional coupler and a measurement unit. The first directional coupler outputs parts of travelling waves propagating from the microwave generation unit to the output unit. The measurement unit determines a first high measured value and a first low measured value respectively indicating a high level and a low level of power of a travelling wave at the output unit on the basis of the parts of the travelling waves output from the first directional coupler. The measurement unit averages the first high measured value and the first low measured value with a predetermined movement average time and a predetermined sampling interval. The microwave generation unit may control high level power of the pulse-modulated microwave on the basis of the averaged first high measured value and the high level setting power, and may control low level power of the pulse-modulated microwave on the basis of the averaged first low measured value and the low level setting power.

In this case, in the microwave output device, high level power of a pulse-modulated microwave is controlled on the basis of an averaged first high measured value and high level setting power. Low level power of a pulse-modulated microwave is controlled on the basis of the averaged first low measured value and the low level setting power. As mentioned above, since power of a microwave is pulse-modulated, and high level power and low level power are controlled on the basis of setting power, pulse-modulated power of the microwave can be controlled.

In an exemplary embodiment, the microwave output device may further include a second directional coupler. The second directional coupler outputs parts of reflected waves returned to the output unit. The measurement unit may further determine a second high measured value and a second low measured value respectively indicating a high level and a low level of power of a reflected wave at the output unit on the basis of the parts of the reflected waves output from the second directional coupler, and may average the second high measured value and the second low measured value with a predetermined movement average time and a predetermined sampling interval. The microwave generation unit may control high level power of the pulse-modulated microwave on the basis of the averaged first high measured value, the averaged second high measured value, and the high level setting power, and may control low level power of the pulse-modulated microwave on the basis of the averaged first low measured value, the averaged second low measured value, and the low level setting power.

In the microwave output device, high level power of a pulse-modulated microwave is controlled on the basis of the averaged first high measured value, the averaged second high measured value, and the high level setting power. Low level power of a pulse-modulated microwave is controlled on the basis of the averaged first low measured value, the averaged second low measured value, and the low level setting power. As mentioned above, since power of a microwave is pulse-modulated, and high level power and low level power are controlled on the basis of setting power, pulse-modulated power of the microwave can be controlled.

In another aspect, there is provided a plasma processing apparatus. The plasma processing apparatus includes a chamber main body and the microwave output device. The microwave output device is configured to output a microwave for exciting a gas to be supplied to the chamber main body. The microwave output device is the microwave output device according to any one of the aspects.

According to various aspects and exemplary embodiments of the present disclosure, it is possible to provide a technique for outputting a microwave allowing a pulse frequency and a duty ratio of a pulse-modulated microwave to be easily monitored.

Hereinafter, various exemplary embodiments will be described in detail with reference to the drawings. In the drawings, the same reference numeral will be given to the same portion or an equivalent portion in the drawings.

First Exemplary Embodiment

Plasma Processing Apparatus

FIG. 1 is a diagram illustrating a plasma processing apparatus according to an exemplary embodiment. As illustrated in FIG. 1, a plasma processing apparatus 1 includes a chamber main body 12 and a microwave output device 16.

The plasma processing apparatus 1 may further include a stage 14, an antenna 18, and a dielectric window 20.

The chamber main body 12 provides a processing space S at the inside thereof. The chamber main body 12 includes a side wall 12a and a bottom portion 12b. The side wall 12a is formed in an approximately cylindrical shape. A central axial line of the side wall 12a approximately matches an axial line Z which extends in a vertical direction. The bottom portion 12b is provided on a lower end side of the side wall 12a. An exhaust hole 12h for exhaust is provided in the bottom portion 12b. An upper end of the side wall 12a is an opening.

The dielectric window 20 is provided over the upper end of the side wall 12a. The dielectric window 20 includes a lower surface 20a which faces the processing space S. The dielectric window 20 closes the opening in the upper end of the side wall 12a. An O-ring 19 is interposed between the dielectric window 20 and the upper end of the side wall 12a. The chamber main body 12 is more reliably sealed due to the O-ring 19.

The stage 14 is accommodated in the processing space S. The stage 14 is provided to face the dielectric window 20 in the vertical direction. The stage 14 is provided such that the processing space S is provided between the dielectric window 20 and the stage 14. The stage 14 is configured to support a workpiece WP (for example, a wafer) which is mounted thereon.

In an exemplary embodiment, the stage 14 includes a base 14a and an electrostatic chuck 14c. The base 14a has an approximately disc shape, and is formed from a conductive material such as aluminum. A central axial line of the base 14a approximately matches the axial line Z. The base 14a is supported by a cylindrical support 48. The cylindrical support 48 is formed from an insulating material, and extends from the bottom portion 12b in a vertically upward direction. A conductive cylindrical support 50 is provided on an outer circumference of the cylindrical support 48. The cylindrical support 50 extends from the bottom portion 12b of the chamber main body 12 along the outer circumference of the cylindrical support 48 in a vertically upward direction. An annular exhaust path 51 is formed between the cylindrical support 50 and the side wall 12a.

A baffle plate 52 is provided at an upper portion of the exhaust path 51. The baffle plate 52 has an annular shape. A plurality of through-holes, which pass through the baffle plate 52 in a plate thickness direction, are formed in the baffle plate 52. The above-described exhaust hole 12h is provided on a lower side of the baffle plate 52. An exhaust device 56 is connected to the exhaust hole 12h through an exhaust pipe 54. The exhaust device 56 includes an automatic pressure control valve (APC), and a vacuum pump such as a turbo-molecular pump. A pressure inside the processing space S may be reduced to a desired vacuum degree by the exhaust device 56.

The base 14a also functions as a radio frequency electrode. A radio frequency power supply 58 for radio frequency bias is electrically connected to the base 14a through a feeding rod 62 and a matching unit 60. The radio frequency power supply 58 outputs a constant frequency which is suitable to control ion energy which is inducted to the workpiece WP, for example, a radio frequency of 13.65 MHz with power which is set.

The radio frequency power supply 58 may have a pulse generator, and may pulse-modulate radio frequency power (RF power) which is then output to the base 14a. In this case, the radio frequency power supply 58 pulse-modulates the radio frequency power such that high level power and low level power are periodically repeated. The radio frequency power supply 58 performs pulse adjustment on the basis of a synchronization signal PSS-R generated by the pulse generator. The synchronization signal PSS-R is a signal for determining a cycle and a duty ratio of the radio frequency power. As an example of setting during pulse modulation, a pulse frequency is 10 Hz to 250 kHz, and a duty ratio of a pulse (a ratio of a high level power time to a pulse cycle) is 10% to 90%.

The matching unit 60 accommodates a matching device configured to attain matching between impedance on the radio frequency power supply 58 side, and impedance mainly on a load side such as an electrode, plasma, and the chamber main body 12. A blocking capacitor for self-bias generation is included in the matching device. In a case where radio frequency power is pulse-modulated, the matching unit 60 is operated to perform matching on the basis of the synchronization signal PSS-R.

The electrostatic chuck 14c is provided on an upper surface of the base 14a. The electrostatic chuck 14c holds the workpiece WP with an electrostatic suction force. The electrostatic chuck 14c includes an electrode 14d, an insulating film 14e, and an insulating film 14f, and has an approximately disc shape. A central axial line of the electrostatic chuck 14c approximately matches the axial line Z. The electrode 14d of the electrostatic chuck 14c is configured with a conductive film, and is provided between the insulating film 14e and the insulating film 14f. A DC power supply 64 is electrically connected to the electrode 14d through a switch 66 and a covered wire 68. The electrostatic chuck 14c can suction and hold the workpiece WP by a coulomb's force which is generated by a DC voltage applied from the DC power supply 64. A focus ring 14b is provided on the base 14a. The focus ring 14b is disposed to surround the workpiece WP and the electrostatic chuck 14c.

A coolant chamber 14g is provided at the inside of the base 14a. For example, the coolant chamber 14g is formed to extend around the axial line Z. A coolant is supplied into the coolant chamber 14g from a chiller unit through a pipe 70. The coolant, which is supplied into the coolant chamber 14g, returns to the chiller unit through a pipe 72. A temperature of the coolant is controlled by the chiller unit, and thus a temperature of the electrostatic chuck 14c and a temperature of the workpiece WP are controlled.

A gas supply line 74 is formed in the stage 14. The gas supply line 74 is provided to supply a heat transfer gas, for example, a He gas to a space between an upper surface of the electrostatic chuck 14c and a rear surface of the workpiece WP.

The microwave output device 16 outputs a microwave which excites a process gas which is supplied into the chamber main body 12. The microwave output device 16 is configured to variably adjust a frequency, power, and a bandwidth of the microwave. The microwave output device 16 may generate a microwave having a single frequency by setting, for example, a bandwidth of the microwave to substantially 0. The microwave output device 16 may generate a microwave having a bandwidth having a plurality of frequency components. Power levels of the plurality of frequency components may be the same as each other, and only a center frequency component in the bandwidth may have a power level higher than power levels of other frequency components. In an example, the microwave output device 16 may adjust the power of the microwave in a range of 0 W to 5000 W, may adjust the frequency or the center frequency of the microwave in a range of 2400 MHz to 2500 MHz, and may adjust the bandwidth of the microwave in a range of 0 MHz to 100 MHz. The microwave output device 16 may adjust a frequency pitch (carrier pitch) of the plurality of frequency components of the microwave in the bandwidth in a range of 0 to 25 kHz.

The microwave output device 16 may include a pulse generator, and may pulse-modulate and output power of a microwave. In this case, the microwave output device 16 pulse-modulates the microwave such that high level power and low level power are periodically repeated. The microwave output device 16 adjusts a pulse on the basis of a synchronization signal PSS-M generated by the pulse generator. The synchronization signal PSS-M is a signal for determining a cycle and a duty ratio of microwave power. As an example of setting during pulse modulation, a pulse frequency is 1 Hz to 50 kHz, and a duty ratio of a pulse (a ratio of a high level power time to a pulse cycle) is 10% to 90%. The microwave output device 16 may pulse-modulate microwave power to be synchronized with radio frequency power pulse-modulated, output from the radio frequency power supply 58.

The plasma processing apparatus 1 further includes a wave guide tube 21, a tuner 26, a mode converter 27, and a coaxial wave guide tube 28. An output unit of the microwave output device 16 is connected to one end of the wave guide tube 21. The other end of the wave guide tube 21 is connected to the mode converter 27. For example, the wave guide tube 21 is a rectangular wave guide tube. The tuner 26 is provided in the wave guide tube 21. The tuner 26 has stubs 26a, 26b, and 26c. Each of the stubs 26a, 26b, and 26c is configured to adjust a protrusion amount thereof with respect to an inner space of the wave guide tube 21. The tuner 26 adjusts a protrusion position of each of the stubs 26a, 26b, and 26c with respect to a reference position so as to match impedance of the microwave output device 16 with impedance of a load, for example, impedance of the chamber main body 12.

The mode converter 27 converts a mode of the microwave transmitted from the wave guide tube 21, and supplies the microwave having undergone mode conversion to the coaxial wave guide tube 28. The coaxial wave guide tube 28 includes an outer conductor 28a and an inner conductor 28b. The outer conductor 28a has an approximately cylindrical shape, and a central axial line thereof approximately matches the axial line Z. The inner conductor 28b has an approximately cylindrical shape, and extends on an inner side of the outer conductor 28a. A central axial line of the inner conductor 28b approximately matches the axial line Z. The coaxial wave guide tube 28 transmits the microwave from the mode converter 27 to the antenna 18.

The antenna 18 is provided on a surface 20b opposite to the lower surface 20a of the dielectric window 20. The antenna 18 includes a slot plate 30, a dielectric plate 32, and a cooling jacket 34.

The slot plate 30 is provided on a surface 20b of the dielectric window 20. The slot plate 30 is formed from a conductive metal, and has an approximately disc shape. A central axial line of the slot plate 30 approximately matches the axial line Z. A plurality of slot holes 30a are formed in the slot plate 30. In an example, the plurality of slot holes 30a constitute a plurality of slot pairs. Each of the plurality of slot pairs includes two slot holes 30a which extend in directions interesting each other and have an approximately elongated hole shape. The plurality of slot pairs are arranged along one or more concentric circles centering around the axial line Z. In addition, a through-hole 30d, through which a conduit 36 to be described later can pass, is formed in the central portion of the slot plate 30.

The dielectric plate 32 is formed on the slot plate 30. The dielectric plate 32 is formed from a dielectric material such as quartz, and has an approximately disc shape. A central axial line of the dielectric plate 32 approximately matches the axial line Z. The cooling jacket 34 is provided on the dielectric plate 32. The dielectric plate 32 is provided between the cooling jacket 34 and the slot plate 30.

A surface of the cooling jacket 34 has conductivity. A flow passage 34a is formed at the inside of the cooling jacket 34. A coolant is supplied to the flow passage 34a. A lower end of the outer conductor 28a is electrically connected to an upper surface of the cooling jacket 34. A lower end of the inner conductor 28b passes through a hole formed in a central portion of the cooling jacket 34 and the dielectric plate 32 and is electrically connected to the slot plate 30.

A microwave from the coaxial wave guide tube 28 propagates through the inside of the dielectric plate 32 and is supplied to the dielectric window 20 from the plurality of slot holes 30a of the slot plate 30. The microwave, which is supplied to the dielectric window 20, is introduced into the processing space S.

The conduit 36 passes through an inner hole of the inner conductor 28b of the coaxial wave guide tube 28. As described above, the through-hole 30d, through which the conduit 36 can pass, is formed at the central portion of the slot plate 30. The conduit 36 extends to pass through the inner hole of the inner conductor 28b, and is connected to a gas supply system 38.

The gas supply system 38 supplies a process gas for processing the workpiece WP to the conduit 36. The gas supply system 38 may include a gas source 38a, a valve 38b, and a flow rate controller 38c. The gas source 38a is a gas source of the process gas. The valve 38b switches supply and supply stoppage of the process gas from the gas source 38a. For example, the flow rate controller 38c is a mass flow controller, and adjusts a flow rate of the process gas from the gas source 38a.

The plasma processing apparatus 1 may further include an injector 41. The injector 41 supplies a gas from the conduit 36 to a through-hole 20h which is formed in the dielectric window 20. The gas, which is supplied to the through-hole 20h of the dielectric window 20, is supplied to the processing space S. The process gas is excited by a microwave which is introduced into the processing space S from the dielectric window 20. According to this, plasma is generated in the processing space S, and the workpiece WP is processed by active species such as ions and/or radicals from the plasma.

The plasma processing apparatus 1 further includes a controller 100. The controller 100 collectively controls respective units of the plasma processing apparatus 1. The controller 100 may include a processor such as a CPU, a user interface, and a storage unit.

The processor executes a program and a process recipe which are stored in the storage unit so as to collectively control respective units such as the microwave output device 16, the stage 14, the gas supply system 38, and the exhaust device 56.

The user interface includes a keyboard or a touch panel with which a process manager performs a command input operation and the like so as to manage the plasma processing apparatus 1, a display which visually displays an operation situation of the plasma processing apparatus 1 and the like.

The storage unit stores control programs (software) for realizing various kinds of processing executed by the plasma processing apparatus 1 by a control of the processor, a process recipe including process condition data and the like, and the like. The processor calls various kinds of control programs from the storage unit and executes the control programs in correspondence with necessity including an instruction from the user interface. Desired processing is executed in the plasma processing apparatus 1 under the control of the processor.

Example of Microwave

Figure 2:
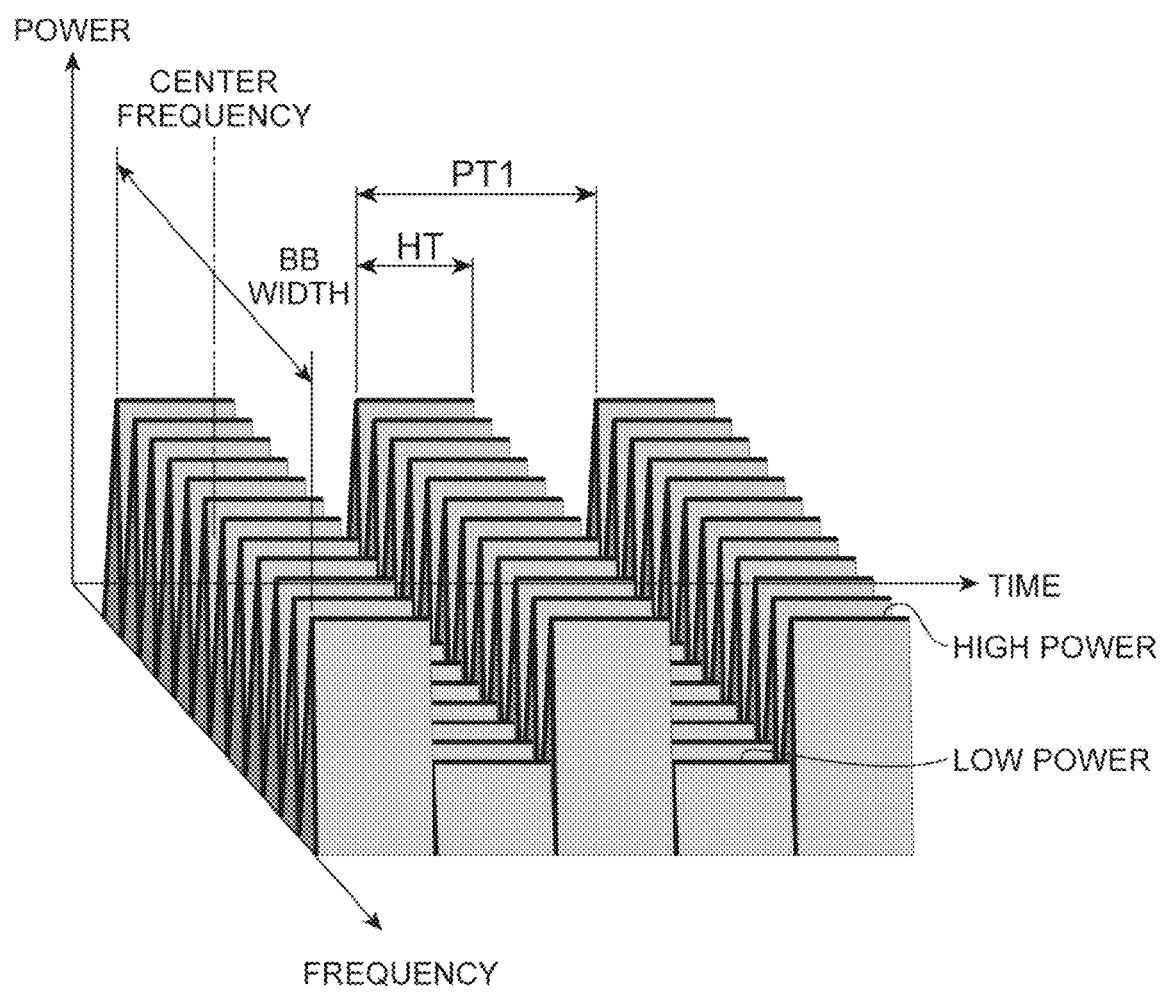
FIG. 2 is a diagram illustrating an example of a microwave of which power is pulse-modulated.

Power of a microwave output from the microwave output device 16 has a waveform modulated in a pulsed shape such that high level power and low level power are repeated. FIG. 2 illustrates an example of a microwave of which power is pulse-modulated. As illustrated in FIG. 2, a microwave in high power has a center frequency and a bandwidth respectively corresponding to a setting frequency and a setting bandwidth for which instructions are given from the controller 100, and has a pulse frequency, a duty ratio, and high level power, respectively corresponding to a setting pulse frequency, a setting duty ratio, and high level setting power for which instructions are given from the controller 100. The microwave in low power has a center frequency and a bandwidth respectively corresponding to a setting frequency and a setting bandwidth for which instructions are given from the controller 100, and has a pulse frequency, a duty ratio, and low level power, respectively corresponding to a setting pulse frequency, a setting duty ratio, and low level setting power for which instructions are given from the controller 100. The low level power is power lower than the high level power.

The low level power may be power equal to or higher than the lowest level required to maintain a plasma generation state. As an example, low level setting power may be equal to or higher than 500 W. In a case where the low level setting power is 0 W, microwave power is subjected to ON/OFF control. In a case where the low level setting power exceeds 0 W and 400 W or less, microwave power is subjected to high/low control to the extent to which plasma excitation does not occur in a low level.

Configuration Example of Microwave Output Device 16

Figure 3:
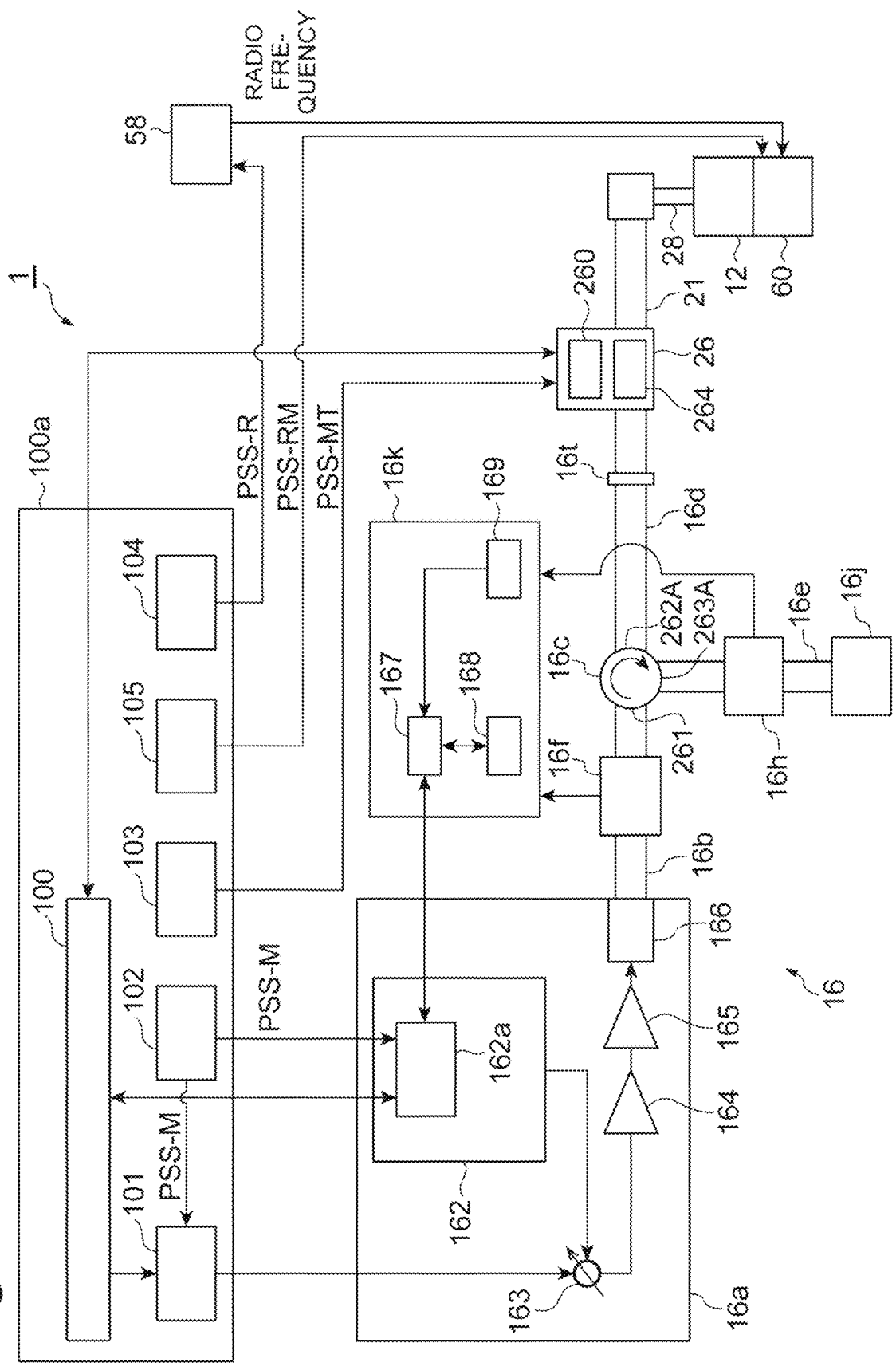
FIG. 3 is a diagram illustrating an example of a microwave output device.

FIG. 3 is a diagram illustrating an example of the microwave output device. As illustrated in FIG. 3, the microwave output device 16 is connected to a calculation device 100a. The calculation device 100a includes a controller 100, a waveform generator 101, a first pulse generator 102, a second pulse generator 103, a third pulse generator 104, and a fourth pulse generator 105.

The waveform generator 101 generates a waveform of a microwave. The waveform generator 101 may generate two types of waveforms of a microwave. As a first waveform, the waveform generator 101 generates a waveform of a microwave having a center frequency and a bandwidth respectively corresponding to a setting frequency and a setting bandwidth designated by the controller 100. As a second waveform, the waveform generator 101 generates a waveform of a microwave having a single frequency peak at a center frequency corresponding to a setting frequency for which an instruction is given from the controller 100.

The first pulse generator 102 generates a synchronization signal. The synchronization signal is used to determine timings of generating the two types of waveforms of a microwave, and to pulse-modulate microwave power in the microwave output device 16. The first pulse generator 102 generates the synchronization signal PSS-M on the basis of a setting pulse frequency and a setting duty ratio of microwave power in a setting profile which is set by the controller 100. The first pulse generator 102 outputs the synchronization signal PSS-M to the waveform generator 101 and the microwave output device 16.

The waveform generator 101 alternately outputs a waveform of a microwave having a bandwidth and a waveform of a microwave having a single frequency peak. The waveform generator 101 is operated on the basis of the synchronization signal PSS-M output from the first pulse generator 102. The waveform generator 101 determines a timing of generating a waveform of a microwave having a bandwidth and a timing of generating a waveform of a microwave having a single frequency peak on the basis of the synchronization signal PSS-M. The waveform generator 101 outputs the waveforms of the microwave to the microwave output device 16.

The second pulse generator 103 generates a synchronization signal which is used to subject microwave power of which power is pulse-modulated to impedance matching in the tuner 26. In the same manner as the first pulse generator 102, the second pulse generator 103 generates a synchronization signal PSS-MT on the basis of a setting pulse frequency and a setting duty ratio of microwave power in a setting profile which is set by the controller 100. The synchronization signal PSS-MT has the same pulse frequency and duty ratio as those of the synchronization signal PSS-M. The second pulse generator 103 outputs the synchronization signal PSS-MT to the tuner 26.

The third pulse generator 104 generates a synchronization signal which is used to pulse-modulate radio frequency power in the radio frequency power supply 58. The third pulse generator 104 generates a synchronization signal PSS-R on the basis of a setting pulse frequency and a setting duty ratio of radio frequency power in a setting profile which is set by the controller 100. The third pulse generator 104 outputs the synchronization signal PSS-R to the radio frequency power supply 58.

The fourth pulse generator 105 generates a synchronization signal which is used to subject a radio frequency of which power is pulse-modulated to impedance matching in the matching unit 60. In the same manner as the third pulse generator 104, the fourth pulse generator 105 generates a synchronization signal PSS-RM on the basis of a setting pulse frequency and a setting duty ratio of radio frequency power in a setting profile which is set by the controller 100. The synchronization signal PSS-RM has the same pulse frequency and duty ratio as those of the synchronization signal PSS-R. The fourth pulse generator 105 outputs the synchronization signal PSS-RM to the matching unit 60.

The first pulse generator 102 may generate the synchronization signal PSS-M which is synchronized with the synchronization signal PSS-R. In this case, pulse-modulation of microwave power and pulse-modulation of radio frequency power can be synchronized with each other, and thus it is possible to stably generate plasma.

The microwave output device 16 pulse-modulates the waveform of the microwave generated by the waveform generator 101 according to the setting in the controller 100, and outputs the microwave. The microwave output device 16 includes a microwave generation unit 16a, a wave guide tube 16b, a circulator 16c, a wave guide tube 16d, a wave guide tube 16e, a first directional coupler 16f, a second directional coupler 16h, a measurement unit 16k (an example of a measurement unit), and a dummy load 16j.

The microwave generation unit 16a generates the microwave of which power is pulse-modulated so as to obtain a setting pulse frequency, a duty ratio, high level power, and low level power respectively corresponding to a pulse frequency, a setting duty ratio, high level setting power, and low level setting power for which instructions are given by the controller 100.

The microwave generation unit 16a includes a power control unit 162, an attenuator 163, an amplifier 164, an amplifier 165, and a mode converter 166.

The waveform generator 101 is connected to the attenuator 163. The attenuator 163 is a device which can changes an attenuation amount (attenuation rate) according to an applied voltage value as an example. The attenuator 163 is connected to the power control unit 162. The power control unit 162 controls an attenuation rate (attenuation amount) of a microwave in the attenuator 163 by using an applied voltage value. The power control unit 162 controls an attenuation rate (attenuation amount) of a microwave in the attenuator 163 such that a microwave output from the waveform generator 101 becomes a microwave having power corresponding to a setting pulse frequency, a setting duty ratio, high level setting power, and low level setting power for which instructions are given by the controller 100.

The power control unit 162 includes the control unit 162a as an example. The control unit 162a may be a processor. The control unit 162a acquires a setting profile from the controller 100. The control unit 162a acquires the synchronization signal PSS-M from the first pulse generator 102. The control unit 162a determines an attenuation rate (attenuation amount) of a microwave on the basis of the synchronization signal PSS-M, and the setting profile which is set by the controller 100.

An output of the attenuator 163 is connected to the mode converter 166 via the amplifier 164 and the amplifier 165. Each of the amplifier 164 and the amplifier 165 amplifies a microwave at a predetermined amplification rate. The mode converter 166 converts a propagation mode of a microwave output from the amplifier 165 from TEM into TE01. A microwave, which is generated through the mode conversion in the mode converter 166, is output as an output microwave of the microwave generation unit 16a.

An output of the microwave generation unit 16a is connected to one end of the wave guide tube 16b. The other end of the wave guide tube 16b is connected to a first port 261 of the circulator 16c. The circulator 16c includes a first port 261, a second port 262A, and a third port 263A. The circulator 16c outputs a microwave, which is input to the first port 261, from the second port 262A, and outputs a microwave, which is input to the second port 262A, from the third port 263A. One end of the wave guide tube 16d is connected to the second port 262A of the circulator 16c. The other end of the wave guide tube 16d is an output unit 16t of the microwave output device 16.

One end of the wave guide tube 16e is connected to the third port 263A of the circulator 16c. The other end of the wave guide tube 16e is connected to the dummy load 16j. The dummy load 16j receives a microwave which propagates through the wave guide tube 16e and absorbs the microwave. For example, the dummy load 16j converts the microwave into heat.

The first directional coupler 16f is provided between one end and the other end of the wave guide tube 16b. The first directional coupler 16f is configured to branch parts of microwaves (that is, travelling waves) which are output from the microwave generation unit 16a and propagate to the output unit 16t, and to output the parts of the travelling waves.

The second directional coupler 16h is provided between one end and the other end of the wave guide tube 16e. The second directional coupler 16h is configured to branch parts of reflected waves transmitted to the third port 263A of the circulator 16c with respect to microwaves which return to the output unit 16t, and to output the parts of the reflected waves.

The measurement unit 16k is a device which measures a microwave in the wave guide tube. The measurement unit 16k includes a measurement control unit 167, a first wave detection unit 168, and a second wave detection unit 169.

The first wave detection unit 168 detects a measured value corresponding to travelling wave power of a microwave in the wave guide tube. The first wave detection unit 168 receives a travelling wave output from the first directional coupler 16f. The second wave detection unit 169 detects a measured value corresponding to reflected wave power of a microwave in the wave guide tube. The second wave detection unit 169 receives a reflected wave output from the second directional coupler 16h.

The measurement control unit 167 determines a first high measured value pf(H) and a first low measured value pf(L) respectively indicating a high level and a low level of power of a travelling wave at the output unit 16t on the basis of parts of travelling waves acquired by the first wave detection unit 168. The measurement control unit 167 determines a second high measured value pr(H) and a second low measured value pr(L) respectively indicating a high level and a low level of power of a reflected wave at the output unit 16t on the basis of parts of reflected waves acquired by the second wave detection unit 169.

The measurement control unit 167 acquires a frequency and a duty ratio of travelling wave power on the basis of a measured value detected by the first wave detection unit 168.

The measurement unit 16k is connected to the power control unit 162. The measurement unit 16k outputs the measured values to the power control unit 162. The power control unit 162 controls the attenuator 163 such that a difference between the measured values of a travelling wave and a reflected wave, that is, load power (effective power) matches setting power designated by the controller 100 (power feedback control).

The tuner 26 includes a tuner control unit 260 and a tuner wave detection unit 264. The tuner control unit 260 adjusts protrusion positions of the stubs 26a, 26b, and 26c such that impedance on the microwave output device 16 side matches impedance on the antenna 18 on the basis of a signal from the controller 100 and a detection result in the tuner wave detection unit 264. The tuner wave detection unit 264 is a three-probe wave detector as an example, and has three probes with diodes. The tuner control unit 260 causes a driver circuit and an actuator (not illustrated) to operate the stubs 26a, 26b, and 26c.

The tuner control unit 260 acquires the synchronization signal PSS-MT for microwave power generated by the second pulse generator 103. The tuner control unit 260 operates the stubs 26a, 26b, and 26c on the basis of the synchronization signal. The radio frequency power supply 58 acquires the synchronization signal PSS-R for radio frequency power generated by the third pulse generator 104. The radio frequency power supply 58 pulse-modulates radio frequency power on the basis of the synchronization signal PSS-R. The matching unit 60 acquires the synchronization signal PSS-MT for radio frequency power generated by the fourth pulse generator 105. The matching unit 60 performs matching on pulse-modulated radio frequency power on the basis of the synchronization signal PSS-MT.

Details of Waveform Generator

Figure 4:
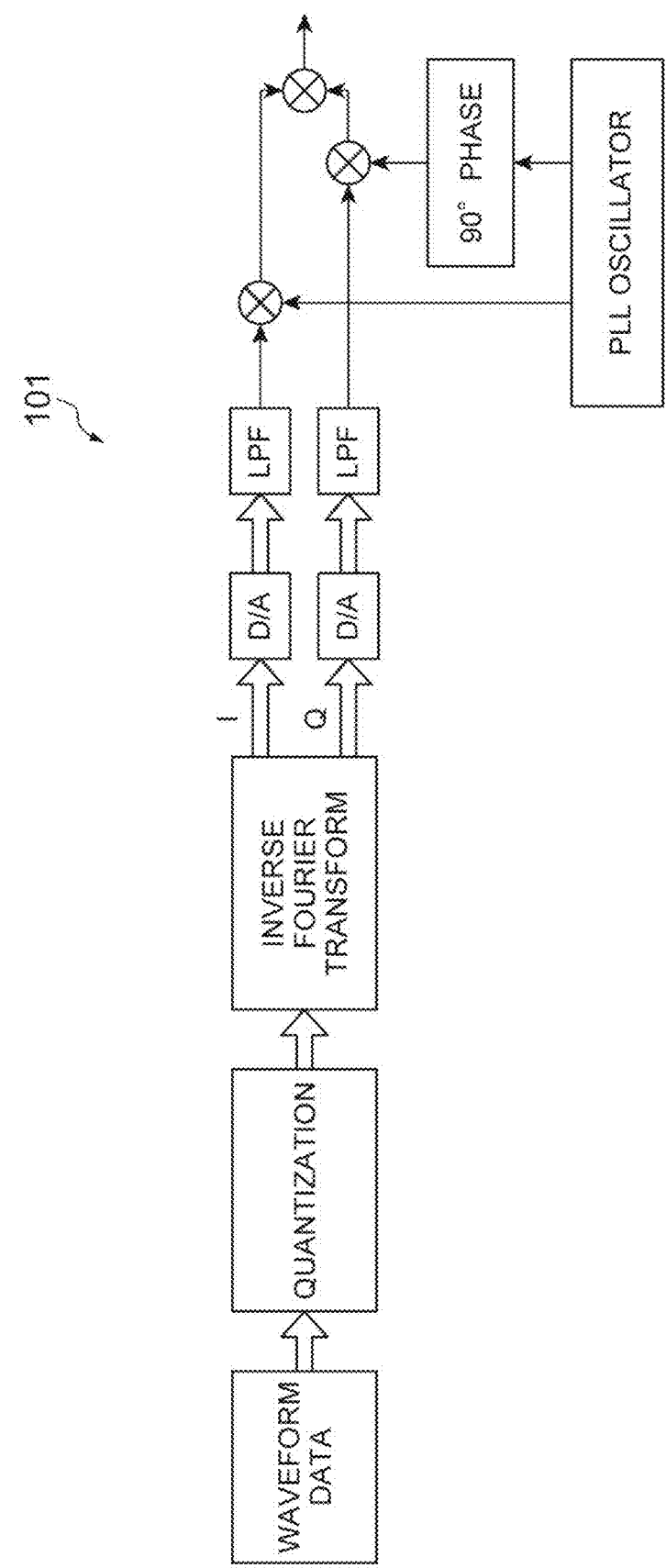
FIG. 4 is a diagram illustrating a microwave generation principle in a waveform generator.

FIG. 4 is a view illustrating a microwave generation principle in the waveform generator. As illustrated in FIG. 4, for example, the waveform generator 101 includes a phase locked loop (PLL) oscillator which can cause a microwave of which a phase is synchronized with that of a reference frequency to oscillate, and an IQ digital modulator which is connected to the PLL oscillator. The waveform generator 101 sets a frequency of a microwave which oscillates in the PLL oscillator to a setting frequency designated by the controller 100. The waveform generator 101 modulates a microwave from the PLL oscillator, and a microwave having a phase difference with the microwave from the PLL oscillator by 90° by using the IQ digital modulator. Consequently, the waveform generator 101 generates a microwave having a plurality of frequency components in a bandwidth or a microwave having a single frequency.

The waveform generator 101 may perform inverse discrete Fourier transform on, for example, N complex data symbols so as to generate a continuous signal and thus to generate a microwave having a plurality of frequency components. A method of generating such a signal may be a method such as an orthogonal frequency-division multiple access (OFDMA) modulation method used for digital TV broadcasting (for example, refer to Japanese Patent No. 5320260).

In an example, the waveform generator 101 has waveform data expressed by a digitalized code sequence in advance. The waveform generator 101 quantizes the waveform data, and applies the inverse Fourier transform to the quantized data so as to generate I data and Q data. The waveform generator 101 applies digital/analog (D/A) conversion to each of the I data and the Q data so as to obtain two analog signals. The waveform generator 101 inputs the analog signals to a low-pass filter (LPF) through which only a low frequency component passes. The waveform generator 101 mixes the two analog signals, which are output from the LPF, with a microwave from the PLL oscillator and a microwave having a phase difference with the microwave from the PLL oscillator by 90°, respectively. The waveform generator 101 combines microwaves which are generated through the mixing with each other. Consequently, the waveform generator 101 generates a frequency-modulated microwave having a single frequency component or a plurality of frequency components.

Examples of Waveforms Generated by Waveform Generator

Figure 5A:
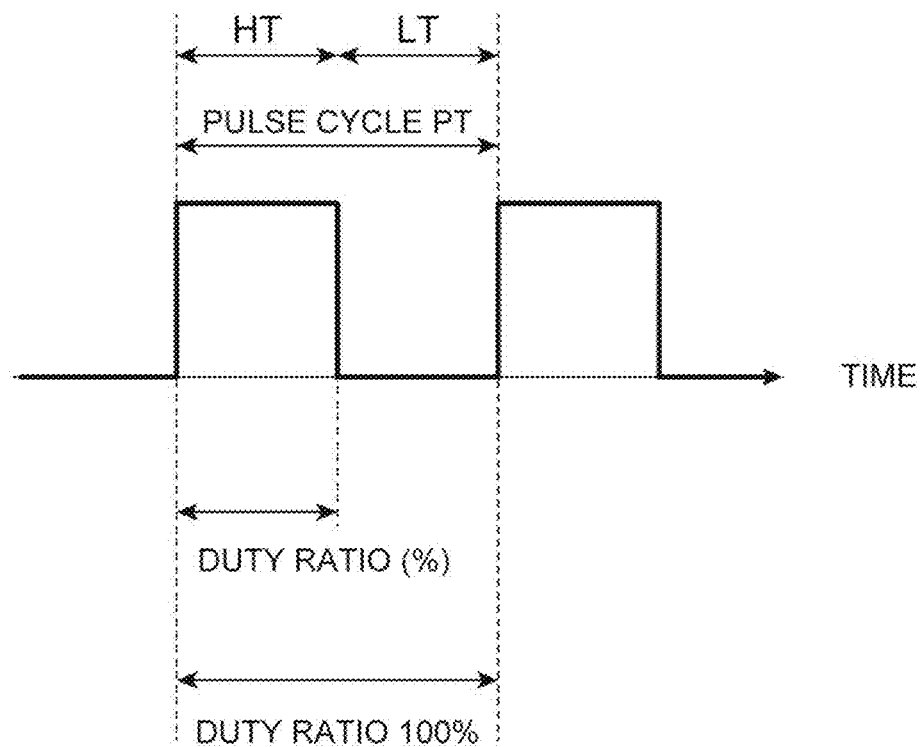
FIGS. 5A and 5B are diagrams illustrating examples of waveforms of a synchronization signal and a microwave.
Figure 5B:
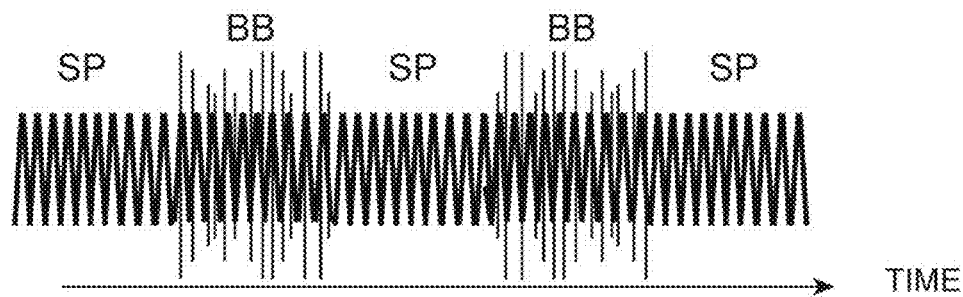

The waveform generator 101 may alternately generate a microwave having a single frequency component and a microwave having a plurality of frequency components on the basis of the synchronization signal PSS-M. Hereinafter, a description will be made of examples of a synchronization signal and a microwave generated by the waveform generator. FIGS. 5A and 5B are diagrams illustrating examples of a synchronization signal and a microwave. As illustrated in FIG. 5A, the synchronization signal PSS-M is a pulse signal of which an ON state (high state) and an OFF state (low state) alternately appear. A pulse cycle PT of the synchronization signal PSS-M is defined by an interval between high level timings. A ratio of a high time HT to the pulse cycle PT is the duty ratio. The first pulse generator 102 generates a synchronization signal as illustrated in FIG. 5A on the basis of the pulse frequency (1/PT) and the duty ratio (HT/PT×100%) designated by the controller 100.

The waveform generator 101 generates a waveform of a microwave having a broadband frequency during the high time HT, and generates a waveform of a microwave having a single frequency peak during a low time LT. In FIG. 5B, the waveform of the microwave having the broadband frequency is indicated by a broadband (BB) waveform, and the waveform of the microwave having the single frequency peak is indicated by a single peak (SP) waveform. The waveform generator 101 may reverse generation timings for a BB waveform and an SP waveform. In other words, the waveform generator 101 may generate a waveform of a microwave having a single frequency peak during the high time HT, and may generate a waveform of a microwave having a broadband frequency during the low time LT.

Example of Control of Power of Microwave

A waveform generated by the waveform generator 101 is output in a state in which power thereof is modulated and amplified. FIG. 6 is a diagram illustrating an example of a configuration related to control of power of a microwave. As illustrated in FIG. 6, power control is realized by the measurement control unit 167 and the control unit 162*a*.

As illustrated in FIG. 6, the waveform generator 101 outputs a waveform of a microwave in which an SP waveform and a BB waveform alternately appear. The control unit 162*a* operates the attenuator 163 to pulse-modulate power of the microwave. The control unit 162*a* determines a high time and a low time on the basis of the synchronization signal PSS-M output from the first pulse generator 102. The control unit 162*a* operates the attenuator 163 such that setting high power PH output from the controller 100 is obtained during the high time, and such that setting low power PL is obtained during the low time. Consequently, a microwave in which only an SP waveform portion is attenuated may be obtained. The microwave is amplified by the amplifier 164 and the amplifier 165, and is then sent to the chamber main body 12.

The measurement control unit 167 acquires a measured value pf0 of a travelling wave and a measured value pr0 of power of a reflected wave from the first directional coupler 16*f* and the second directional coupler 16*h*. The measurement control unit 167 samples the measured values, and outputs the sampled measured values to the control unit 162*a*. The control unit 162*a* performs power feedback such that a difference between the measured value pf of the power of the travelling wave and the measured value pr of the power of the reflected wave is a setting value. The setting value designated by the controller 100 is realized through such a feedback loop.

In a case where power of a microwave is pulse-modulated, it is necessary to individually feedback-control high level power and low level power. In other words, the measurement control unit 167 measures the first high measured value pf(H), the first low measured value pf(L), the second high measured value pr(H), and the second low measured value pr(L), and outputs the measured values to the control unit 162*a*. The control unit 162*a* performs switching between feedback of high level power and feedback of low level power on the basis of the synchronization signal PSS-M.

During feedback of high level power, the control unit 162*a* controls high level power of a pulse-modulated microwave on the basis of the first high measured value pf(H), the second high measured value pr(H), and high level setting power. During feedback of low level power, the control unit 162*a* controls low level power of a pulse-modulated microwave on the basis of the first low measured value pf(L), the second low measured value pr(L), and low level setting power.

More specifically, during feedback of high level power, the control unit 162*a* controls high level power of a microwave output from the microwave output device 16 such that a difference between the first high measured value pf(H) and the second high measured value pr(H) is close to setting high power designated by the controller 100. During feedback of low level power, the control unit 162*a* controls low level power of a microwave output from the microwave output device 16 such that a difference between the first low measured value pf(L) and the second low measured value pr(L) is close to setting low power designated by the controller 100. Consequently, load power of a microwave supplied to a load coupled to the output unit 16*t* can be made close to setting power.

Example of Data Sampling in Measurement Control Unit

Figure 7:
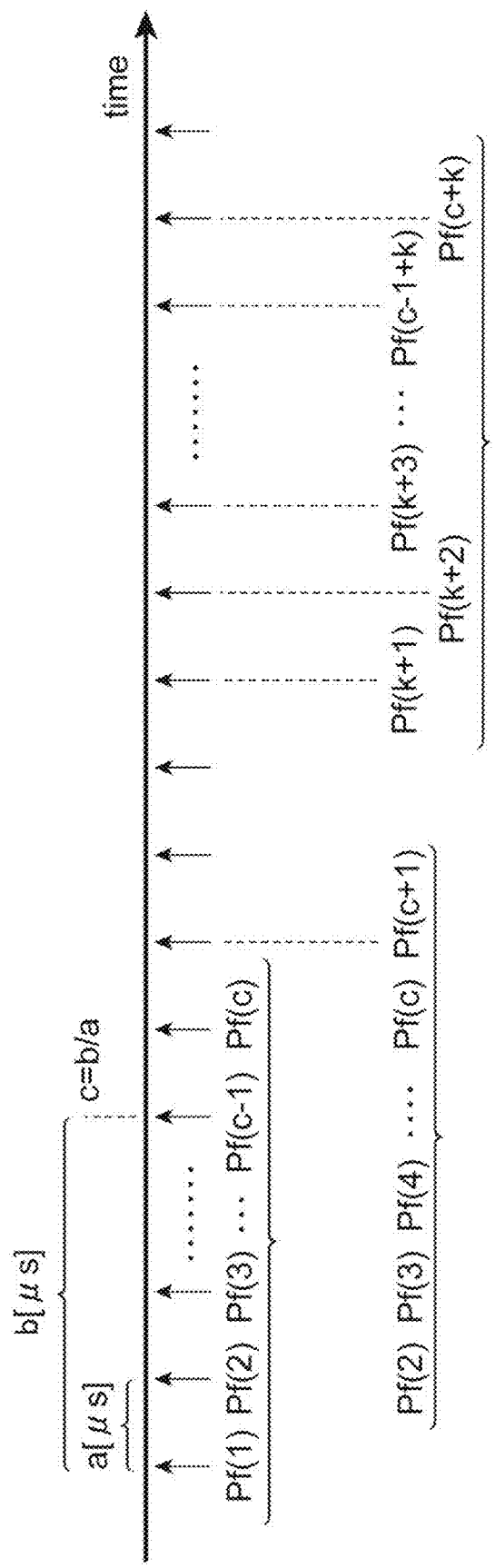
FIG. 7 is a diagram for explaining an example of a movement average.

The measurement control unit 167 may average data in order to accurately measure pulse-modulated travelling wave power. FIG. 7 is a diagram for explaining an example of a movement average. In FIG. 7, a indicates a sampling interval [μs], b indicates a movement average time [μs], and c indicates the number of samples. The sampling interval is 0.1 μs or less. The number of samples c is expressed by b/a. At a time point t=0, the measurement control unit 167 acquires and averages c samples from Pf(1) to Pf(c) at the sampling interval a. At a time point t=1, the measurement control unit 167 acquires and averages c samples from Pf(2) to Pf(c+1) at the sampling interval a. At a time point t=k, the measurement control unit 167 acquires and averages c samples from Pf(k+1) to Pf(c+k) at the sampling interval a. This is expressed by equations as follows.

$$Pf(t) = \frac{1}{c}\sum_{n=1}^{c} pf(n) \quad \text{at } t = 0$$

$$Pf(t) = \frac{1}{c}\sum_{n=1}^{c} pf(n+1) \quad \text{at } t = 1$$

$$\vdots$$

$$Pf(t) = \frac{1}{c}\sum_{n=1}^{c} pf(n+k) \quad \text{at } t = k$$

Consequently, a power waveform having different intensities is averaged. In the above example, an example of a travelling wave has been described, but a reflected wave may be averaged in the same method.

Examples of Sampling Results

Figure 8A:
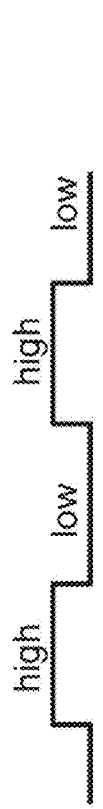
FIGS. 8A to 8F are waveform diagrams illustrating examples of sampling in a measurement unit.
Figure 8B:
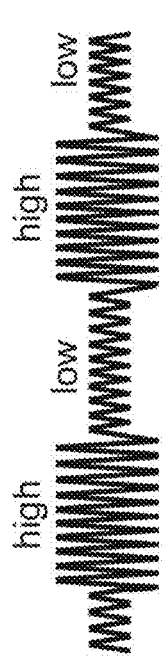
Figure 8C:
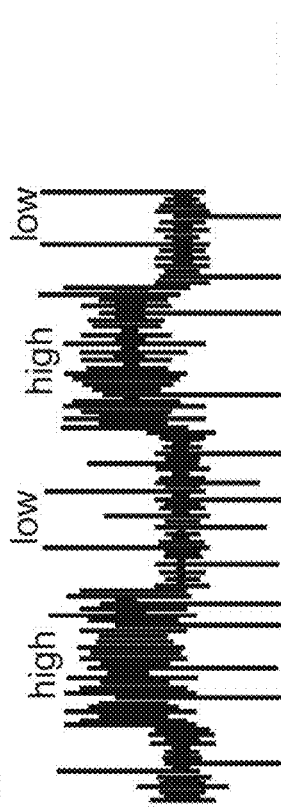
Figure 8D:
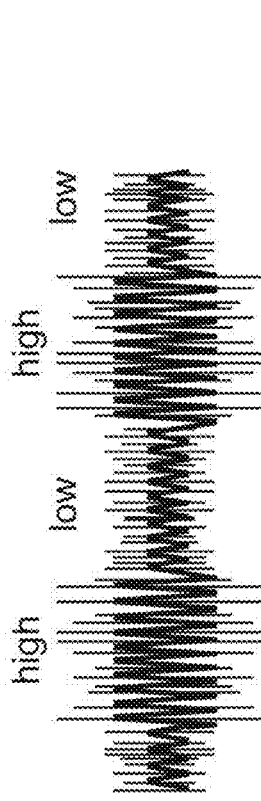
Figure 8E:
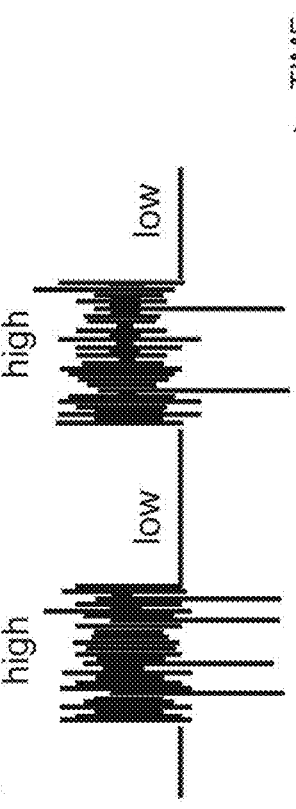
Figure 8F:
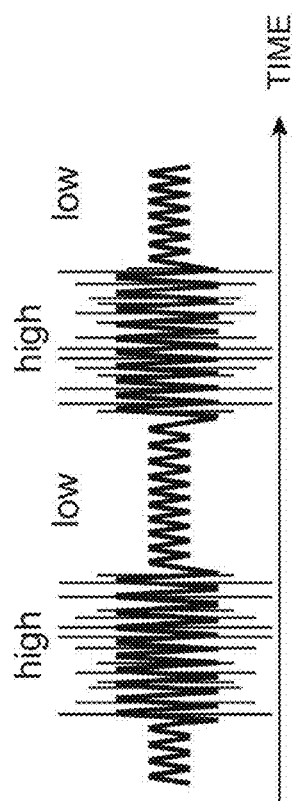

FIGS. 8A to 8F are diagrams illustrating examples of sampling performed by the measurement unit. A waveform in FIG. 8A is a pulse-modulated SP waveform measured by the first directional coupler 16*f*. A waveform in FIG. 8B is a waveform obtained by the measurement control unit 167 sampling the SP waveform in FIG. 8A. As illustrated in FIGS. 8A and 8B, in the pulse-modulated SP waveform, high and low signals after sampling can be clearly differentiated from each other. A waveform in FIG. 8C is a pulse-modulated BB waveform measured by the first directional coupler 16*f*. A waveform in FIG. 8D is a waveform obtained by the measurement control unit 167 sampling the BB waveform in FIG. 8C. As illustrated in FIGS. 8C and 8D, in the pulse-modulated BB waveform, a boundary between high and low signals after sampling is not clear. A waveform in FIG. 8E is a pulse-modulated waveform measured by the first directional coupler 16*f*, and is a waveform in which an SP waveform and a BB waveform alternately appear. A waveform in FIG. 8F is a waveform obtained by the measurement control unit 167 sampling the SP waveform in FIG. 8E. As illustrated in FIGS. 8E and 8F, in the waveform in which the SP waveform and the BB waveform alternately appear, high and low signals after sampling can be clearly differentiated from each other.

Example of Time Chart

Figure 9A:
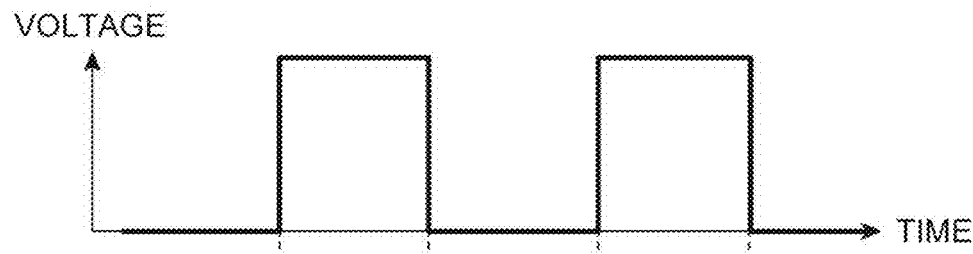
FIGS. 9A to 9D correspond to time charts of a synchronization signal, a waveform in which an SP waveform and a BB waveform alternately appear, a pulse-modulated waveform, and a sampled waveform.
Figure 9B:
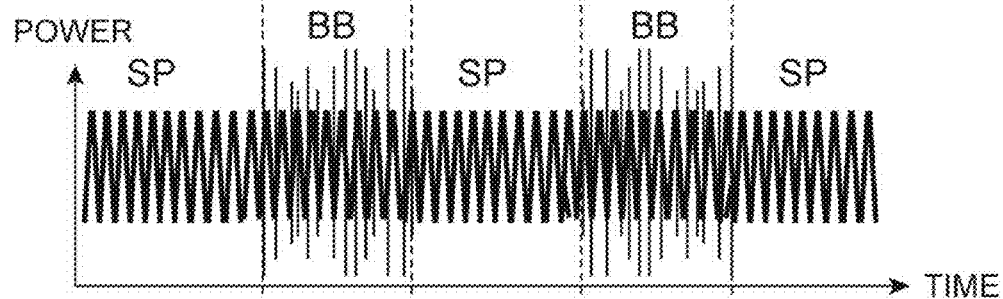
Figure 9C:
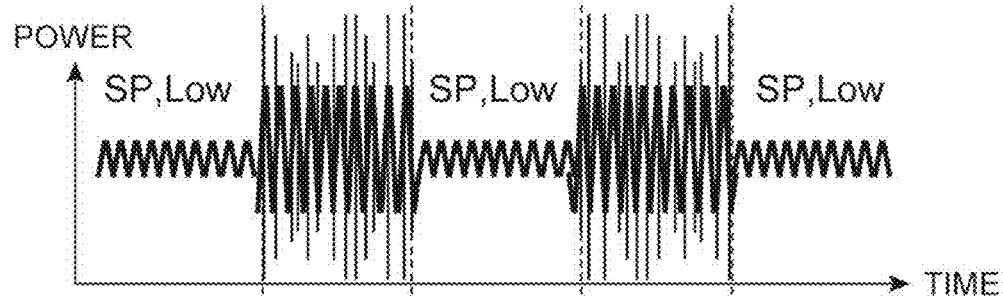
Figure 9D:
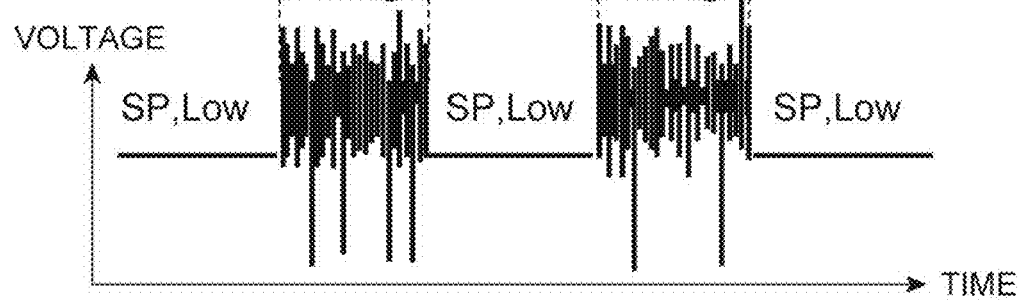

FIGS. 9A to 9D illustrate the above-described synchronization signal, waveform in which the SP waveform and the BB waveform alternately appear, pulse-modulated waveform, and sampled waveform in a state in which time axes thereof match each other. FIGS. 9A to 9D correspond to time charts of the synchronization signal, the waveform in which the SP waveform and the BB waveform alternately appear, the pulse-modulated waveform, and the sampled waveform. FIG. 9A illustrates the synchronization signal PSS-M generated by the first pulse generator 102, FIG. 9B illustrates the waveform generated by the waveform generator 101, FIG. 9C illustrates the waveform pulse-modulated by the control unit 162a, and FIG. 9D illustrates the waveform sampled by the measurement control unit 167.

As illustrated in FIG. 9B, the SP waveform and the BB waveform alternately appear in synchronization with ON and OFF of the synchronization signal PSS-M illustrated in FIG. 9A. In other words, a cycle and a duty ratio of the waveform illustrated in FIG. 9B match the cycle and the duty ratio of the synchronization signal PSS-M. As illustrated in FIG. 9C, power of the SP waveform and power of the BB waveform are separately modulated in synchronization with ON and OFF of the synchronization signal PSS-M illustrated in FIG. 9A. In other words, a cycle and a duty ratio of the waveform illustrated in FIG. 9C match the cycle and the duty ratio of the synchronization signal PSS-M. As illustrated in FIG. 9D, a high portion and a low of the microwave are separately detected.

Example of Switching Between Output Modes

The microwave generation unit 16a may have two output modes. In a first output mode, a microwave having a pulse-modulated BB waveform and SP waveform is output. In a second output mode, a microwave having a pulse-modulated BB waveform is output. The microwave generation unit 16a determines switching between the output modes on the basis of low level setting power and threshold power. The threshold power is a power value predefined in order to determine switching between the output modes. The threshold power may be set between 0 and 500 W. As an example, the threshold power is 0 W. The threshold power is stored in the storage unit of the controller 100 as an example. In a case where the low level setting power is higher than the threshold power, the microwave generation unit 16a is operated in the first output mode, and, in a case where the low level setting power is equal to or lower than the threshold power, the microwave generation unit 16a is operated in the second output mode.

Figure 10:
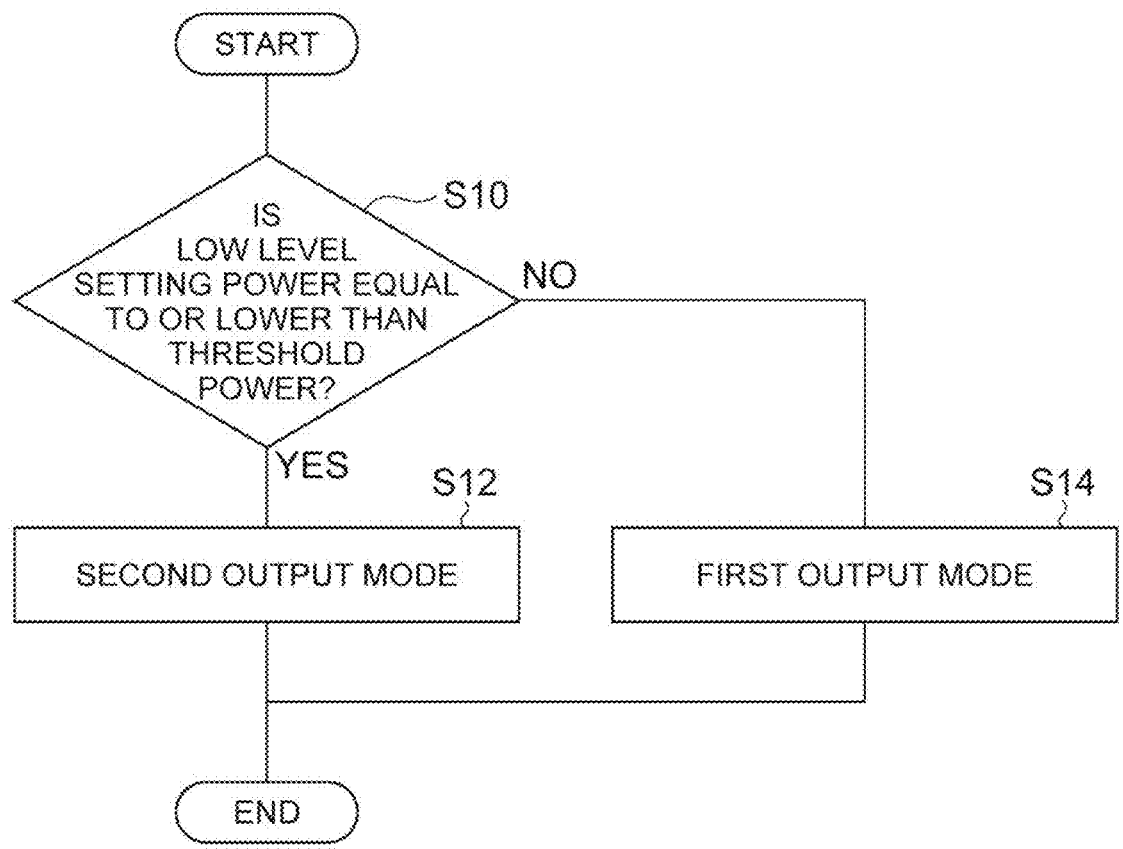
FIG. 10 is a flowchart illustrating an operation of the microwave operation device.

FIG. 10 is a flowchart illustrating an operation of the microwave output device. The flowchart illustrated in FIG. 10 is executed, for example, before the microwave generation unit 16a outputs a microwave.

First, as a determination step (S10), the microwave generation unit 16a determines whether or not low level setting power is equal to or lower than threshold power. The microwave generation unit 16a acquires the low level setting power and the threshold power from the controller 100.

In a case where it is determined that the low level setting power is equal to or lower than the threshold power (S10: YES), the microwave generation unit 16a is operated in the second output mode as a second output step (S12). In this case, the microwave generation unit 16a outputs a microwave having a pulse-modulated BB waveform.

In a case where it is determined that the low level setting power is not equal to or lower than the threshold power (S10: NO), the microwave generation unit 16a is operated in the first output mode as a first output step (S14). In this case, the microwave generation unit 16a outputs a microwave having pulse-modulated BB waveform and SP waveform.

In a case where the second output step (S12) and the first output step (S14) are finished, the flowchart illustrated in FIG. 10 ends. As mentioned above, the microwave output device 16 may perform switching between the output modes according to low level setting power.

Example of Determination of High Level and Low Level of Traveling Wave Power in Measurement Control Unit The measurement control unit 167 may use a plurality of threshold values in order to accurately determine a high level and a low level of pulse-modulated traveling wave power. For example, a first upper limit threshold value which is more than high level setting power by a predetermined value and a first lower limit threshold value which is less than the high level setting power by the predetermined value are set. For example, a second upper limit threshold value which is more than low level setting power by a predetermined value and a second lower limit threshold value which is less than the low level setting power by the predetermined value are set.

In a case where sampled values are consecutively included n times between the first upper limit threshold value and the first lower limit threshold value, the measurement control unit 167 determines a high level. In a case where sampled values are consecutively included n times between the second upper limit threshold value and the second lower limit threshold value, the measurement control unit 167 determines a low level. Here, n is the number of times of determination, and is a preset value. In a case where neither the high level determination condition nor the low level determination condition is satisfied, the measurement control unit 167 holds the previous determination value. In other words, in a case where a high level is determined in the previous determination process, a high level is also determined in the present determination process. Similarly, in a case where a low level is determined in the previous determination process, a low level is also determined in the present determination process.

Example of Setting of Measurement Control Unit

The measurement control unit 167 may be set to perform measurement in a range in which measurement errors are reduced. The measurement errors include frequency accuracy and a duty ratio error. The frequency accuracy is an error of a detected pulse frequency relative to a set pulse frequency. As a specific example, the frequency accuracy is expressed by the following Equation (1).

$$\text{Frequency accuracy } [\%] = |(\text{detected frequency} - \text{set frequency})/\text{set frequency}| \times 100 \tag{1}$$

However, in a case where a computed value of the right side of Equation (1) is 100% or more, the frequency accuracy is assumed to be 100%. The duty ratio error is an error of a detected duty ratio relative to a set duty ratio. As a specific example, the duty ratio error is expressed by the following Equation (2).

$$\text{Duty ratio error } [\%] = |\text{detected duty ratio} - \text{set duty ratio}| \times 100 \tag{2}$$

The measurement control unit 167 may employ, as the maximum error, a greater value of the frequency accuracy and the duty ratio error. The number of times of determination n in the measurement control unit 167 is set such that the maximum error is reduced.

Conclusion of First Exemplary Embodiment

In the microwave output device 16, a BB waveform (a microwave having a bandwidth) and an SP waveform (a microwave having a single frequency peak) are alternately output in synchronization with a high level and a low level. The BB waveform is a waveform which temporally rises and falls, and the SP waveform is a waveform which does not temporally greatly rise and fall. Thus, the microwave output device 16 enables a boundary between a high level power section and a low level power section to be easily understood compared with a case where a BB waveform is pulse-modulated. Therefore, the microwave output device 16 can output a microwave allowing a pulse frequency and a duty ratio of a pulse-modulated microwave to be easily monitored.

The microwave output device 16 may perform switching between output modes according to low level setting power. Consequently, in a case where pulse modulation based on an ON/OFF pulse is performed, the microwave output device 16 can stabilize plasma by using a microwave having a BB waveform. In a case where pulse modulation based on a high/low pulse is performed, the microwave output device 16 can make stabilization of plasma and easy monitoring of a microwave compatible by performing switching to a microwave having an SP waveform in either a high section or a low section.

The microwave output device 16 can generate a waveform of a microwave in which a BB waveform and an SP waveform alternately appear on the basis of a pulse synchronization signal, and can perform power control for each waveform on the basis of the pulse synchronization signal.

In the microwave output device 16, high level power of a pulse-modulated microwave is controlled on the basis of an averaged first high measured value and high level setting power. Low level power of a pulse-modulated microwave is controlled on the basis of an averaged first low measured value and low level setting power. As mentioned above, since power of a microwave is pulse-modulated, and high level power and low level power are controlled on the basis of setting power, pulse-modulated power of the microwave can be controlled.

In the microwave output device 16, high level power of a pulse-modulated microwave is controlled on the basis of an averaged first high measured value, an averaged second high measured value, and high level setting power. Low level power of a pulse-modulated microwave is controlled on the basis of an averaged first low measured value, an averaged second low measured value, and low level setting power. As mentioned above, since power of a microwave is pulse-modulated, and high level power and low level power are controlled on the basis of setting power, pulse-modulated power of the microwave can be controlled. The plasma processing apparatus 1 including the microwave output device 16 achieves the same effect as that of the microwave output device 16.

Second Exemplary Embodiment

A plasma processing apparatus 1A according to a second exemplary embodiment is the same as the plasma processing apparatus 1 according to the first exemplary embodiment except that a control unit of the tuner 26 functions as a microwave monitor device. Hereinafter, a difference between the plasma processing apparatus 1A and the plasma processing apparatus 1 will be focused, and repeated description will not be made.

Figure 11:
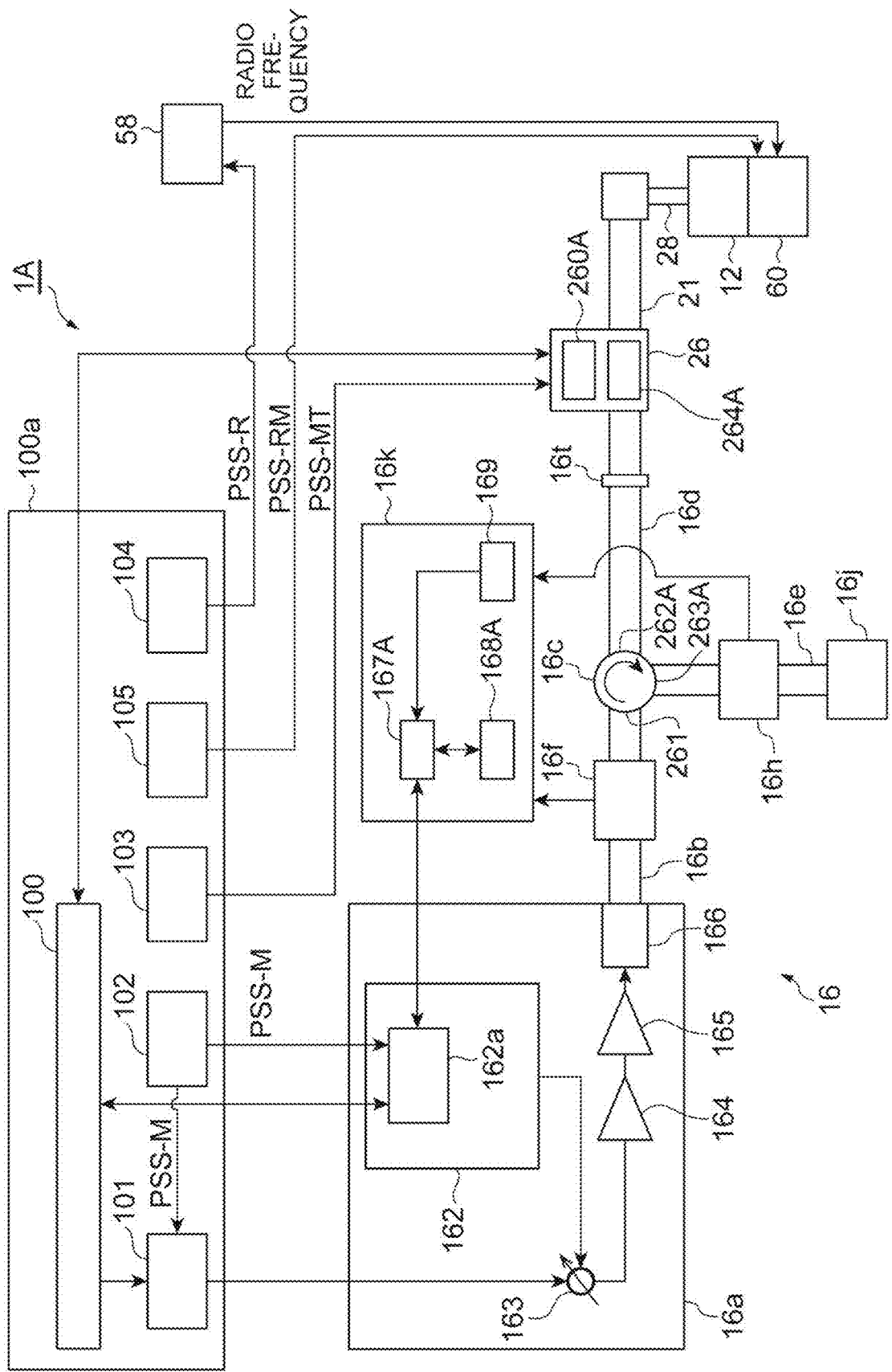
FIG. 11 is a diagram illustrating another example of the plasma processing apparatus.

FIG. 11 is a diagram illustrating another example of the plasma processing apparatus. As illustrated in FIG. 11, the measurement unit 16$k$ includes a measurement control unit 167A and a first wave detection unit 168A. The measurement control unit 167A and the first wave detection unit 168A are the same as the measurement control unit 167 and the first wave detection unit 168 except that a monitor function is not provided.

The tuner 26 includes a tuner control unit 260A and a tuner wave detection unit 264A. The tuner control unit 260A and the tuner wave detection unit 264A are the same as the tuner control unit 260 and the tuner wave detection unit 264 except that a monitor function is provided. In other words, the tuner control unit 260A branches a wave detection signal detected by the tuner wave detection unit 264A so as to acquire a frequency and a duty ratio of travelling wave power of a microwave. Monitoring ways, that is, a movement average time, the number of times of determination, and a threshold value are the same as in the first exemplary embodiment.

A configuration of the plasma processing apparatus 1A is the same as the configuration of the plasma processing apparatus 1 except for the above description.

Third Exemplary Embodiment

A plasma processing apparatus 1B according to a third exemplary embodiment is the same as the plasma processing apparatus 1 according to the first exemplary embodiment except that a demodulation unit 80 and a demodulation control unit 81 are provided. Hereinafter, a difference between the plasma processing apparatus 1B and the plasma processing apparatus 1 will be focused, and repeated description will not be made.

Figure 12:
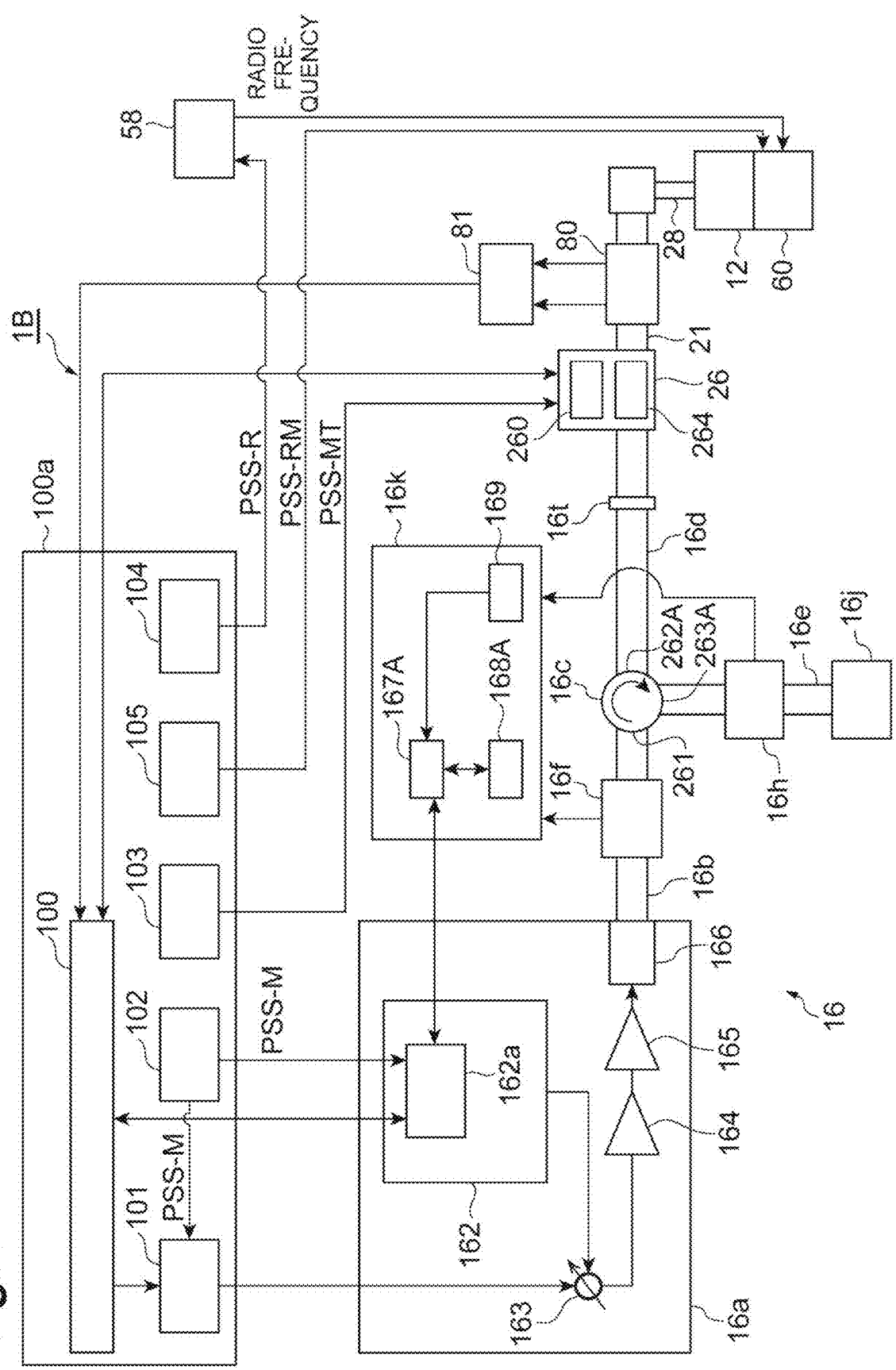
FIG. 12 is a diagram illustrating still another example of the plasma processing apparatus.

FIG. 12 is a diagram illustrating still another example of a plasma processing apparatus. As illustrated in FIG. 12, the measurement unit 16$k$ includes a measurement control unit 167A and a first wave detection unit 168A. The measurement control unit 167A and the first wave detection unit 168A are the same as the measurement control unit 167 and the first wave detection unit 168 except that a pulse monitor function is not provided.

The plasma processing apparatus 1B includes the demodulation unit 80 (an example of a wave detection unit) and the demodulation control unit 81 (an example of an acquisition unit). The demodulation unit 80 is provided between, for example, the tuner 26 and the antenna 18 (refer to FIG. 1) in the wave guide tube 21. The demodulation unit 80 acquires, for each frequency, travelling wave power which is power of a travelling wave which travels through the wave guide tube 21 and reflected wave power which is power of a reflected wave on the antenna 18 side.

The demodulation unit 80 has a directional coupler. The directional coupler is, for example, a bidirectional coupler having four ports. The directional coupler is configured to branch parts of microwaves (that is, travelling waves) which are output from the microwave generation unit 16$a$ and propagate through the wave guide tube 21, and to output the parts of the travelling waves. Similarly, the directional coupler is configured to branch parts of microwaves (that is, reflected waves) returning from the mode converter, and to output the parts of the reflected waves.

The demodulation control unit 81 is a calculator including a processor and a memory. The demodulation control unit 81 measures travelling wave power in the directional coupler on the basis of the parts of the travelling waves output from the directional coupler. Similarly, the demodulation control unit 81 measures reflected wave power in the directional coupler on the basis of the parts of the reflected waves output from the directional coupler. Monitoring ways, that is, a movement average time, the number of times of determination, and a threshold value are the same as in the first exemplary embodiment.

A configuration of the plasma processing apparatus 1B is the same as the configuration of the plasma processing apparatus 1 except for the above description.

As mentioned above, various exemplary embodiments have been described, but the present disclosure is not limited to the exemplary embodiments, and may be variously modified.

In the exemplary embodiments, a description has been made of an example in which the microwave generation unit 16a and the waveform generator 101 are separately configured, but the microwave generation unit 16a and the waveform generator 101 may be configured as a single device. A description has been made of an example in which the calculation device 100a includes the first pulse generator 102 to the fourth pulse generator 105, but this is only an example. For example, the power control unit 162 may include the first pulse generator 102.

In a case where the plasma processing apparatus employs only a mode using travelling wave power of a microwave, the measurement unit 16k may not have a configuration of measuring a reflected wave.

EXAMPLES

Hereinafter, a description will be made of simulation results for explaining effects of the present disclosure.
Waveform of Traveling Wave Power
Waveforms in a case where power of a microwave was pulse-modulated were checked through simulation.

Comparative Example 1

Figure 13A:
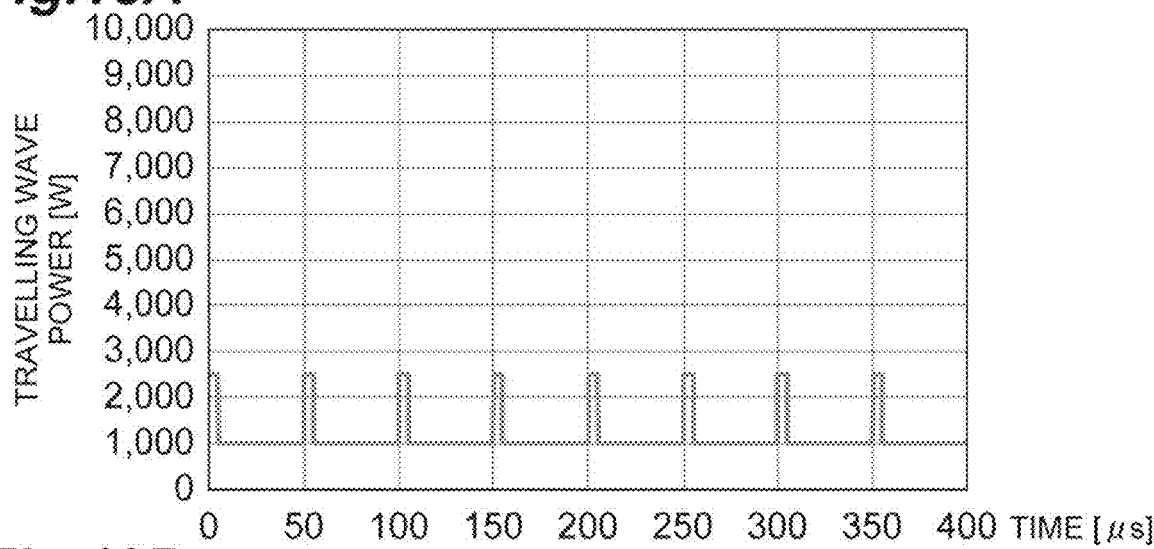
FIGS. 13A to 13C are graphs illustrating results of simulating a relationship between traveling wave power and time every duty ratio in Comparative Example 1 (a microwave having a single frequency peak).
Figure 13B:
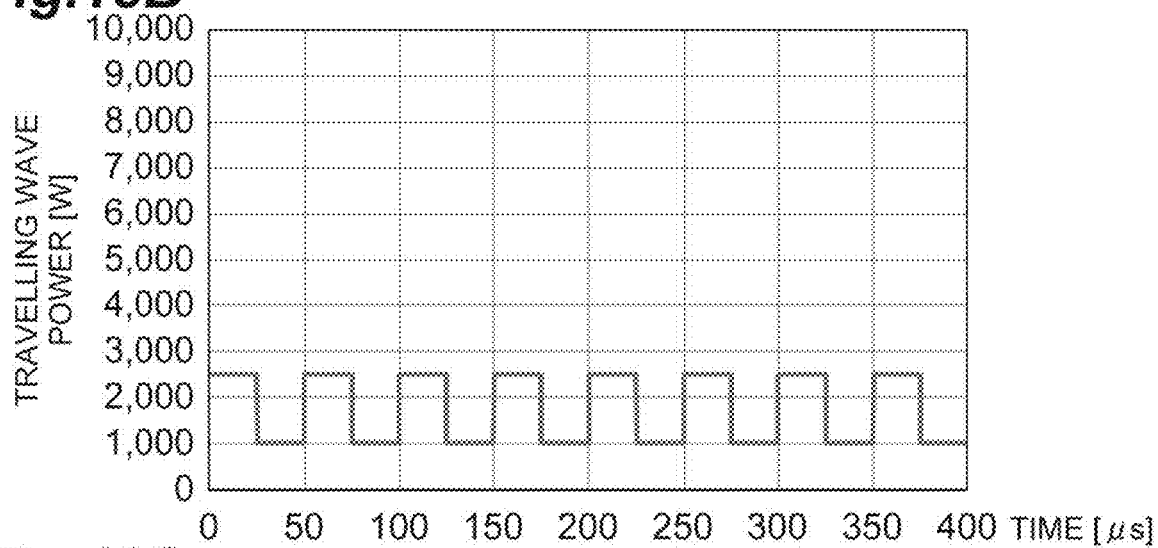
Figure 13C:
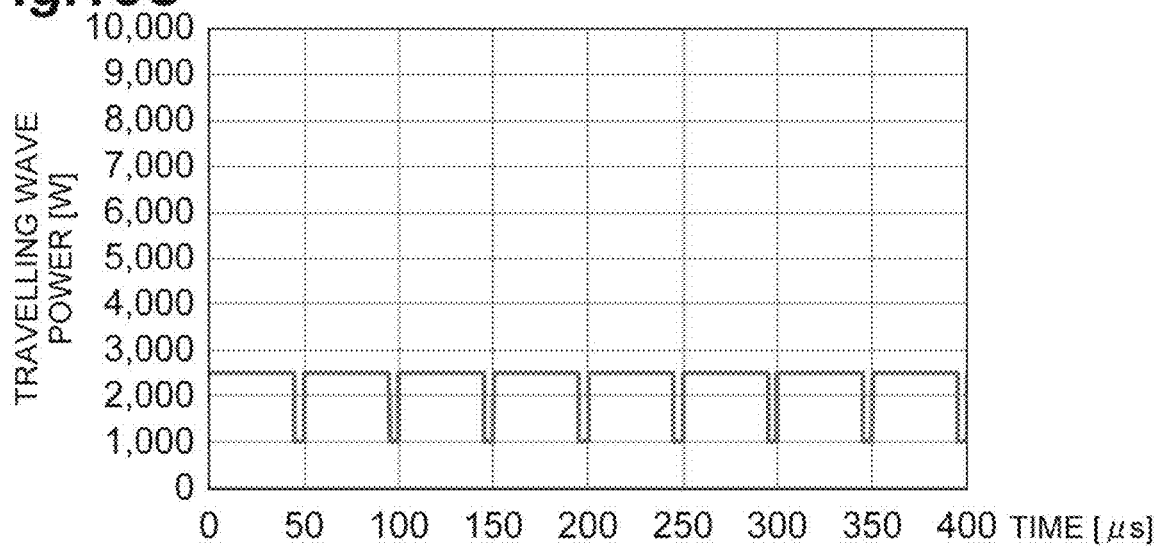

Comparative Example 1 corresponds to a waveform obtained by pulse-modulating a microwave having a single frequency peak. Simulation conditions are as follows.
High level setting power: 2500 W
High level waveform: SP waveform
Low level setting power: 1000 W
Low level waveform: SP waveform
Setting frequency: 2460 MHz
Setting pulse frequency: 20 kHz
Setting duty ratio: 10%, 50%, and 90%
Simulation results are illustrated in FIGS. 13A to 13C.
FIGS. 13A to 13C are graphs illustrating results of simulating a relationship between traveling wave power and time every duty ratio in Comparative Example 1 (a microwave having a single frequency peak). FIG. 13A illustrates a waveform at a duty ratio of 10%. FIG. 13B illustrates a waveform at a duty ratio of 50%. FIG. 13C illustrates a waveform at a duty ratio of 90%. As illustrated in FIGS. 13A to 13C, in a case where the microwave having a single frequency peak was pulse-modulated, it was checked that a high section and a low section can be clearly differentiated from each other regardless of a duty ratio.

Comparative Example 2

Comparative Example 2 corresponds to a waveform obtained by pulse-modulating a microwave having a single frequency peak. Simulation conditions are as follows.
High level setting power: 2500 W
High level waveform: BB waveform
Low level setting power: 500 W, 1000 W, and 2000 W
Low level waveform: BB waveform
Setting frequency: 2460 MHz
Setting bandwidth: 10 MHz
Setting pulse frequency: 20 kHz
Setting duty ratio: 50%
Simulation results are illustrated in FIGS. 14A to 14C.
FIGS. 14A to 14C are graphs illustrating results of simulating a relationship between traveling wave power and time every low power in Comparative Example 2 (a microwave having a broadband frequency). FIG. 14A illustrates a waveform at low level setting power of 500 W. FIG. 14B illustrates a waveform at low level setting power of 1000 W. FIG. 14C illustrates a waveform at low level setting power of 2000 W. A rectangular signal illustrated in each of FIGS. 14A to 14C is the synchronization signal PSS-M. As illustrated in FIGS. 14A to 14C, in a case where the microwave having a broadband frequency was pulse-modulated, it was checked that a boundary between a high section and a low section is not clear. Particularly, it was checked that, as low level setting power is increased, a boundary becomes more unclear.

Comparative Example 3

Figure 15A:
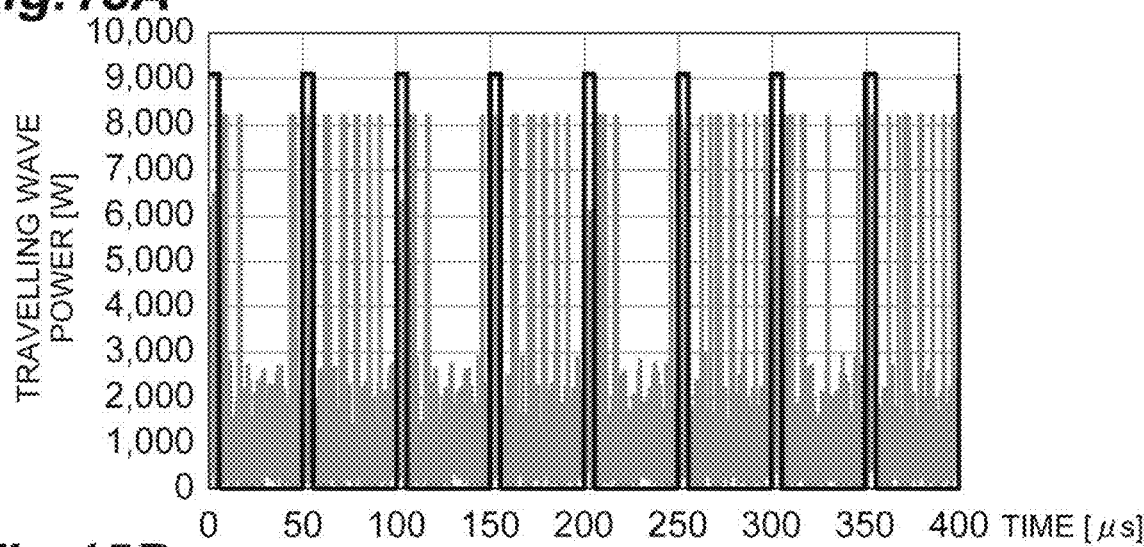
FIGS. 15A to 15C are graphs illustrating results of simulating a relationship between traveling wave power and time every duty ratio in Comparative Example 3 (a microwave having a broadband frequency).
Figure 15B:
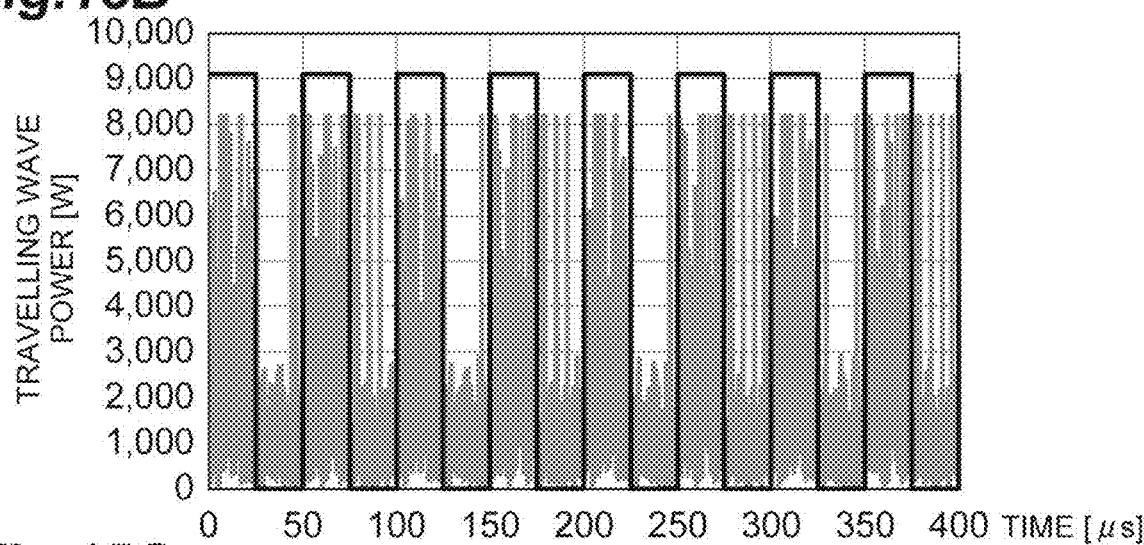
Figure 15C:
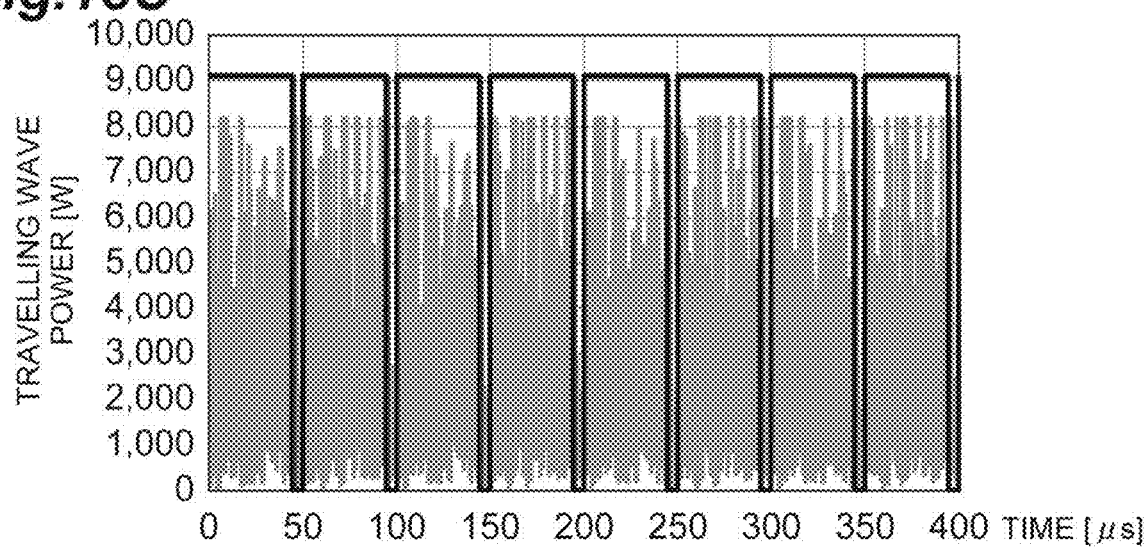

Comparative Example 3 corresponds to a waveform obtained by pulse-modulating a microwave having a single frequency peak. Simulation conditions are as follows.
High level setting power: 2500 W
High level waveform: BB waveform
Low level setting power: 1000 W
Low level waveform: BB waveform
Setting frequency: 2460 MHz
Setting bandwidth: 10 MHz
Setting pulse frequency: 20 kHz
Setting duty ratio: 10%, 50%, and 90%
Simulation results are illustrated in FIGS. 15A to 15C.
FIGS. 15A to 15C are graphs illustrating results of simulating a relationship between traveling wave power and time every duty ratio in Comparative Example 3 (a microwave having a broadband frequency). FIG. 15A illustrates a waveform at a duty ratio of 10%. FIG. 15B illustrates a waveform at a duty ratio of 50%. FIG. 15C illustrates a waveform at a duty ratio of 90%. A rectangular signal illustrated in each of FIGS. 15A to 15C is the synchronization signal PSS-M. As illustrated in FIGS. 15A to 15C, in a case where the microwave having a broadband frequency was pulse-modulated, it was checked that a boundary between a high section and a low section is not clear. Particularly, it was checked that, as a duty ratio is increased, a boundary becomes more unclear.

Example 1

Figure 16A:
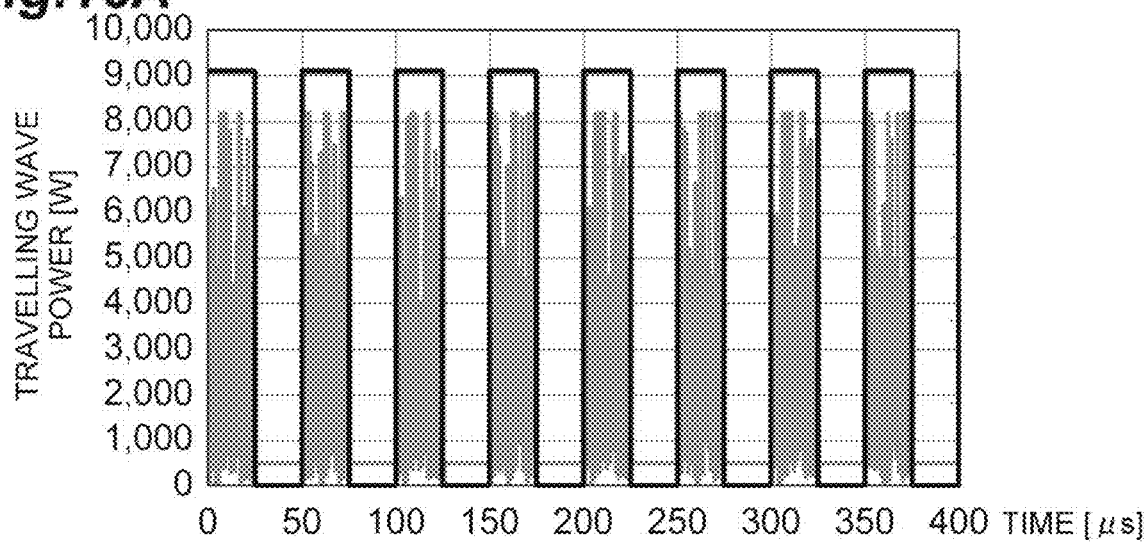
FIGS. 16A to 16C are graphs illustrating results of simulating a relationship between traveling wave power and time every low power in Example 1 (a microwave alternately having a broadband frequency and a single frequency peak).
Figure 16B:
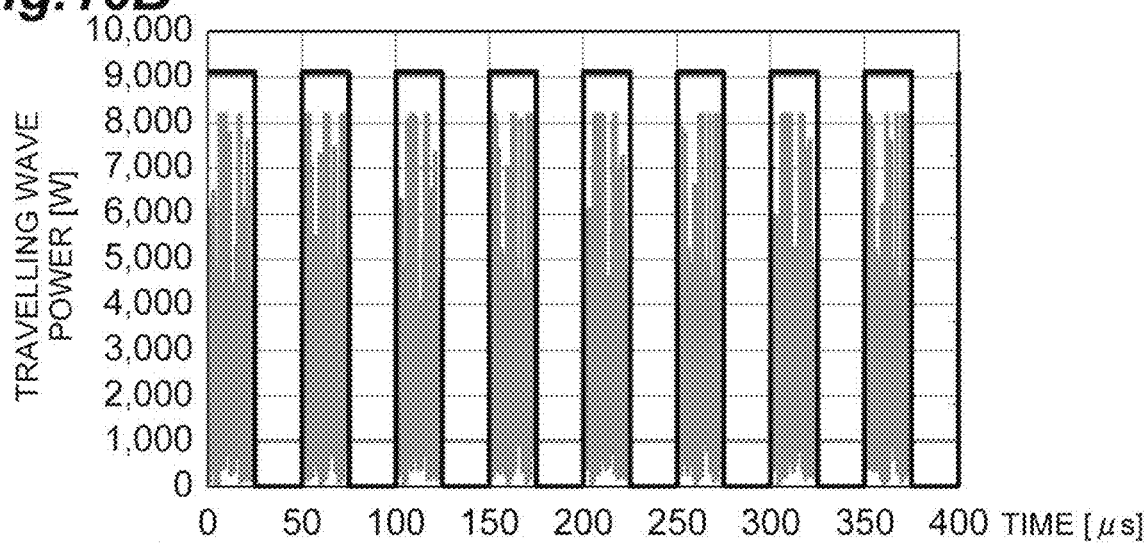
Figure 16C:
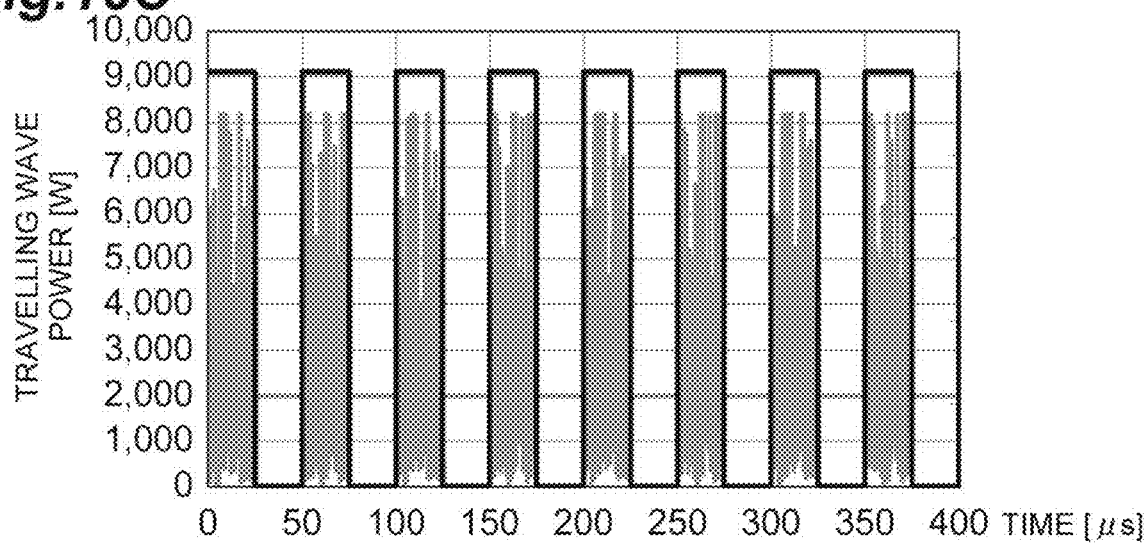

Example 1 corresponds to a pulse-modulated waveform in which a microwave having a broadband frequency and a microwave having a single frequency peak alternately appear. Simulation conditions are as follows.
Low level waveform: SP waveform
Other conditions are the same as those in Comparison Example 2. Simulation results are illustrated in FIGS. 16A to 16C.
FIGS. 16A to 16C are graphs illustrating results of simulating a relationship between traveling wave power and time every low power in Example 1 (a microwave alternately having a broadband frequency and a single frequency peak). FIG. 16A illustrates a waveform at low level setting power of 500 W. FIG. 16B illustrates a waveform at low level setting power of 1000 W. FIG. 16C illustrates a waveform at low level setting power of 2000 W. A rectangular signal illustrated in each of FIGS. 16A to 16C is the synchronization signal PSS-M. As illustrated in FIGS. 16A to 16C, in a case where the microwave alternately having a broadband frequency and a single frequency peak was pulse-modulated, it was checked that a high section and a low section can be clearly differentiated from each other regardless of low level setting power. In Example 1, compared with Comparison Example 2, it was checked that a pulse frequency and a duty ratio of a pulse-modulated microwave are easily monitored.

Example 2

Example 2 corresponds to a pulse-modulated waveform in which a microwave having a broadband frequency and a microwave having a single frequency peak alternately appear. Simulation conditions are as follows.
Low level waveform: SP waveform
Other conditions are the same as those in Comparison Example 3. Simulation results are illustrated in FIGS. 17A to 17C.

Figure 17A:
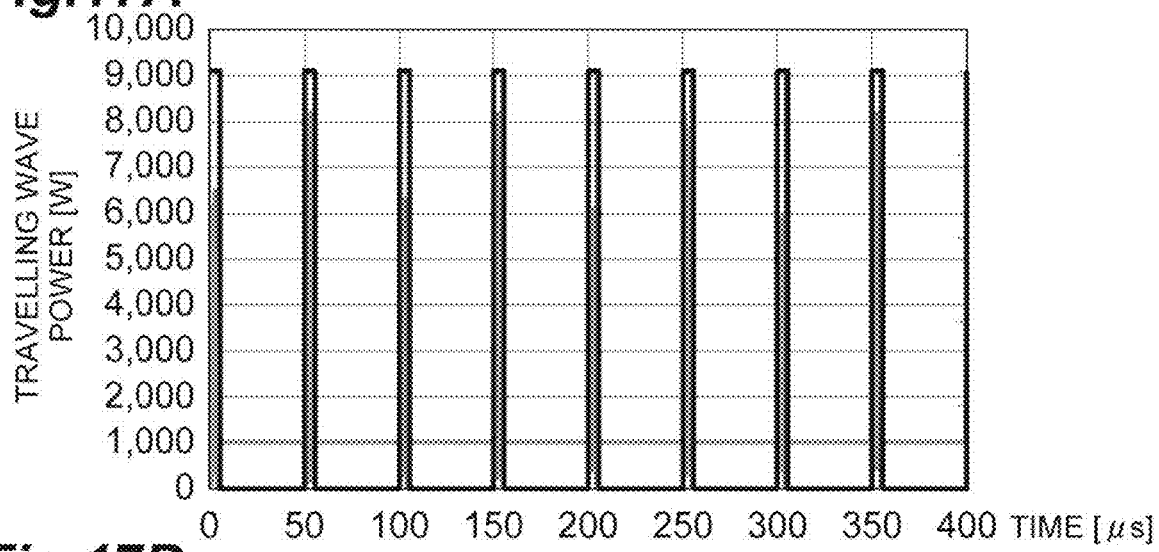
FIGS. 17A to 17C are graphs illustrating results of simulating a relationship between traveling wave power and time every duty ratio in Example 2 (a microwave alternately having a broadband frequency and a single frequency peak).
Figure 17B:
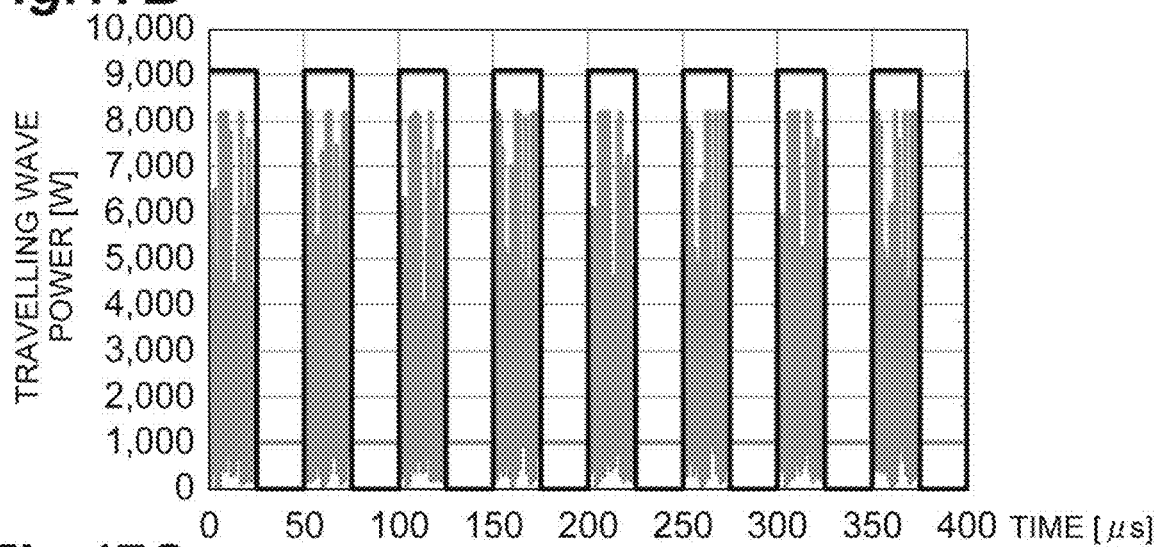
Figure 17C:
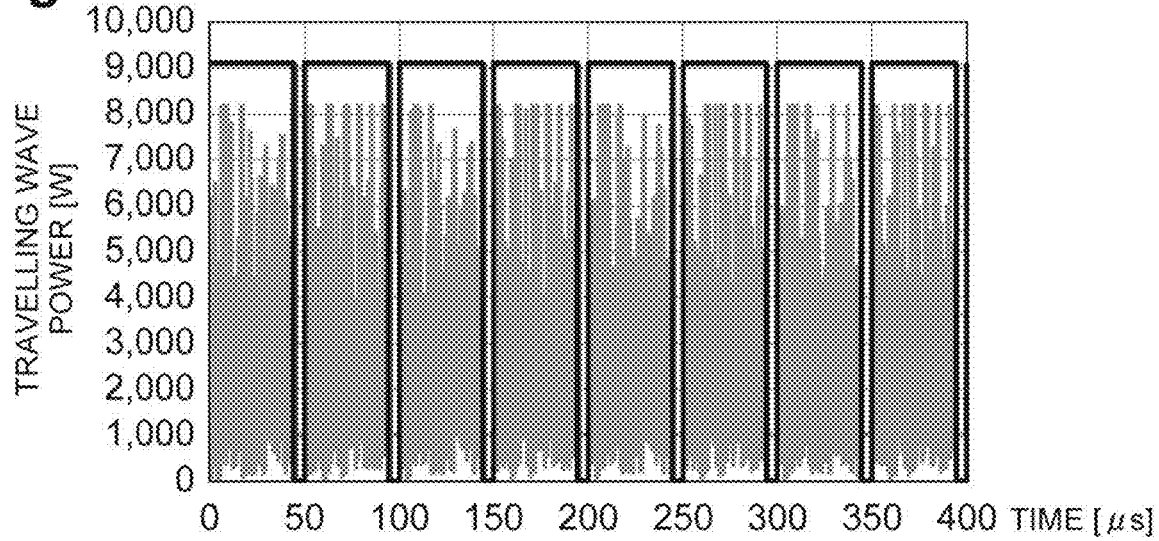

FIGS. 17A to 17C are graphs illustrating results of simulating a relationship between traveling wave power and time every duty ratio in Example 2 (a microwave alternately having a broadband frequency and a single frequency peak). FIG. 17A illustrates a waveform at a duty ratio of 10%. FIG. 17B illustrates a waveform at a duty ratio of 50%. FIG. 17C illustrates a waveform at a duty ratio of 90%. A rectangular signal illustrated in each of FIGS. 17A to 17C is the synchronization signal PSS-M. As illustrated in FIGS. 17A to 17C, in a case where the microwave alternately having a broadband frequency and a single frequency peak was pulse-modulated, it was checked that a high section and a low section can be clearly differentiated from each other regardless of a setting duty ratio. In Example 2, compared with Comparison Example 3, it was checked that a pulse frequency and a duty ratio of a pulse-modulated microwave are easily monitored.

Example 3

Example 3 corresponds to a pulse-modulated waveform in which a microwave having a broadband frequency and a microwave having a single frequency peak alternately appear. Simulation conditions are as follows.
High level waveform: SP waveform
Low level waveform: BB waveform
Other conditions are the same as those in Comparison Example 2. Simulation results are illustrated in FIGS. 18A to 18C.

Figure 18A:
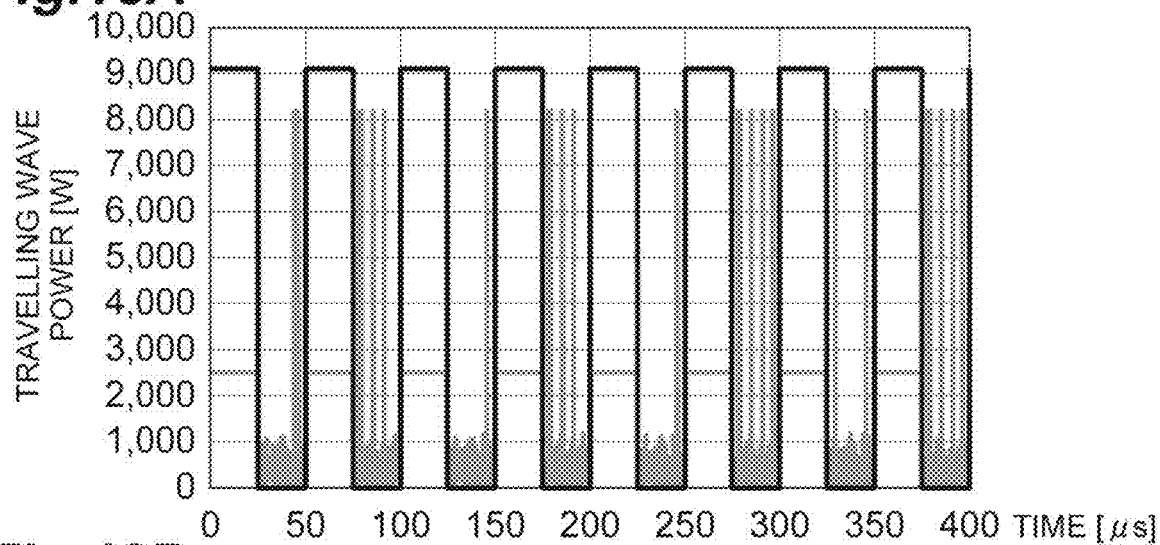
FIGS. 18A to 18C are graphs illustrating results of simulating a relationship between traveling wave power and time every low power in Example 3 (a microwave alternately having a broadband frequency and a single frequency peak).
Figure 18B:
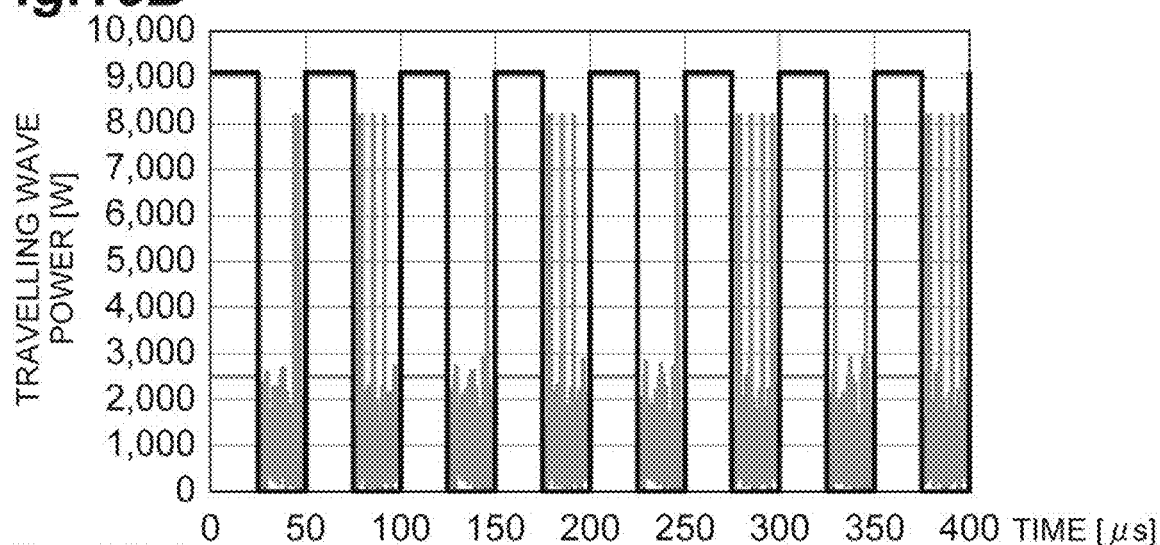
Figure 18C:
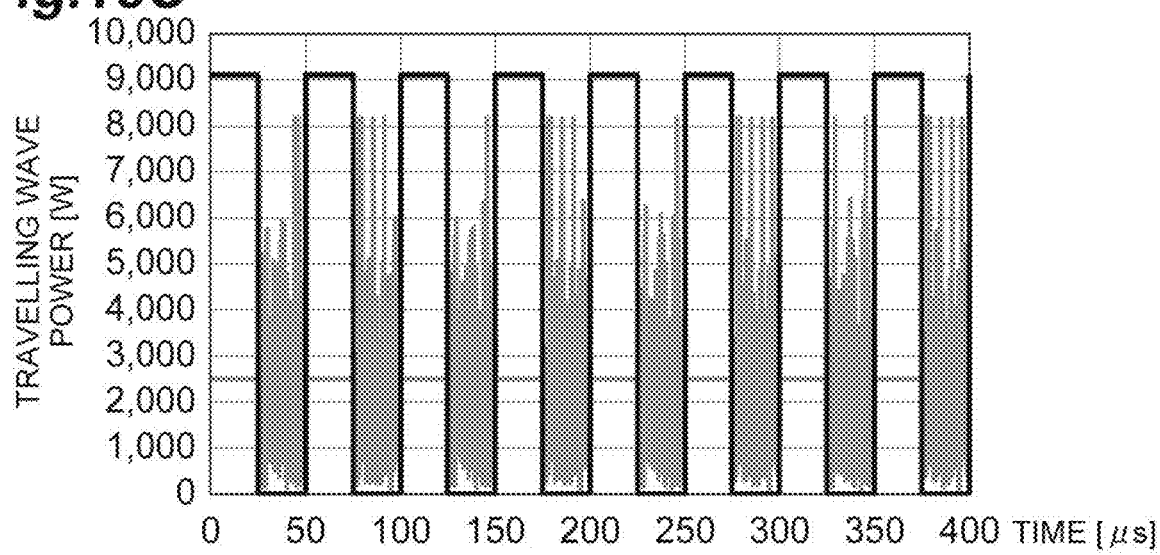

FIGS. 18A to 18C are graphs illustrating results of simulating a relationship between traveling wave power and time every low power in Example 3 (a microwave alternately having a broadband frequency and a single frequency peak). FIG. 18A illustrates a waveform at low level setting power of 500 W. FIG. 18B illustrates a waveform at low level setting power of 1000 W. FIG. 18C illustrates a waveform at low level setting power of 2000 W. A rectangular signal illustrated in each of FIGS. 18A to 18C is the synchronization signal PSS-M. As illustrated in FIGS. 18A to 18C, in a case where the microwave alternately having a broadband frequency and a single frequency peak was pulse-modulated, it was checked that a high section and a low section can be clearly differentiated from each other regardless of low level setting power. In Example 3, compared with Comparison Example 2, it was checked that a pulse frequency and a duty ratio of a pulse-modulated microwave are easily monitored.

Example 4

Example 4 corresponds to a pulse-modulated waveform in which a microwave having a broadband frequency and a microwave having a single frequency peak alternately appear. Simulation conditions are as follows.
High level waveform: SP waveform
Low level waveform: BB waveform
Other conditions are the same as those in Comparison Example 3. Simulation results are illustrated in FIGS. 19A to 19C.

Figure 19A:
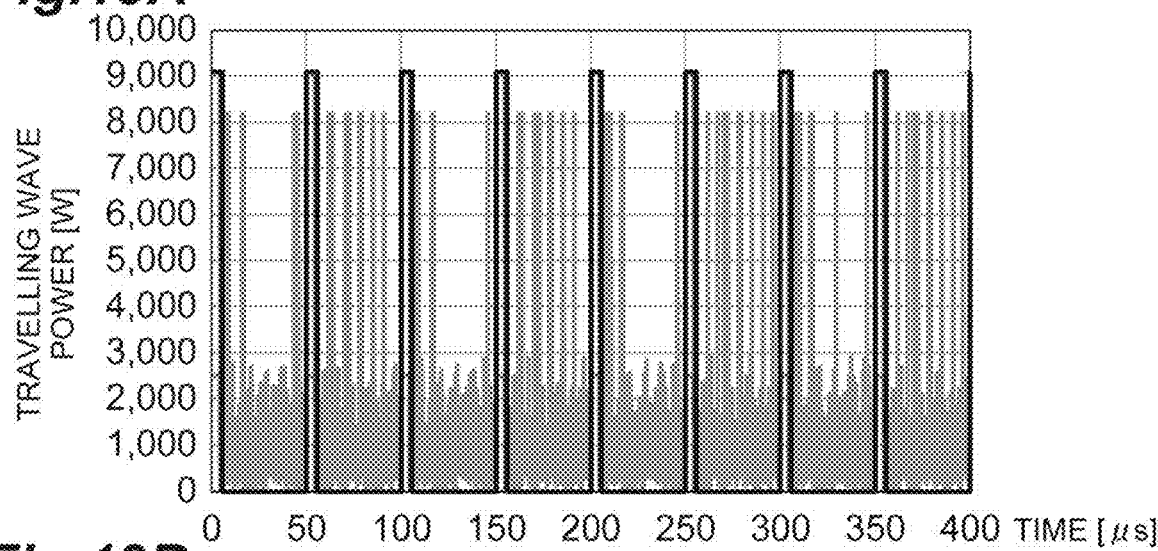
FIGS. 19A to 19C are graphs illustrating results of simulating a relationship between traveling wave power and time every duty ratio in Example 4 (a microwave alternately having a broadband frequency and a single frequency peak).
Figure 19B:
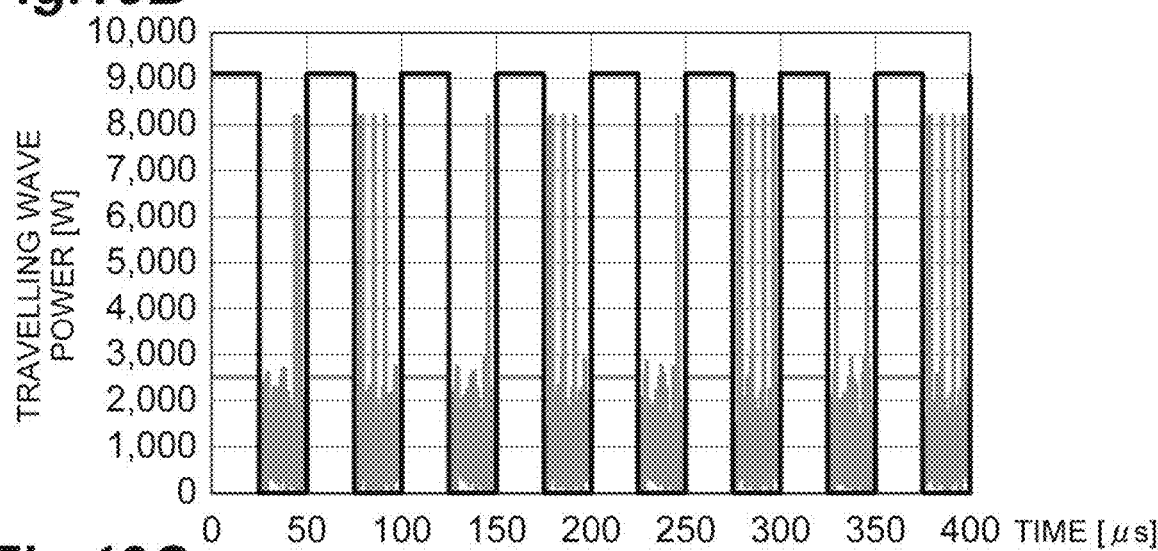
Figure 19C:
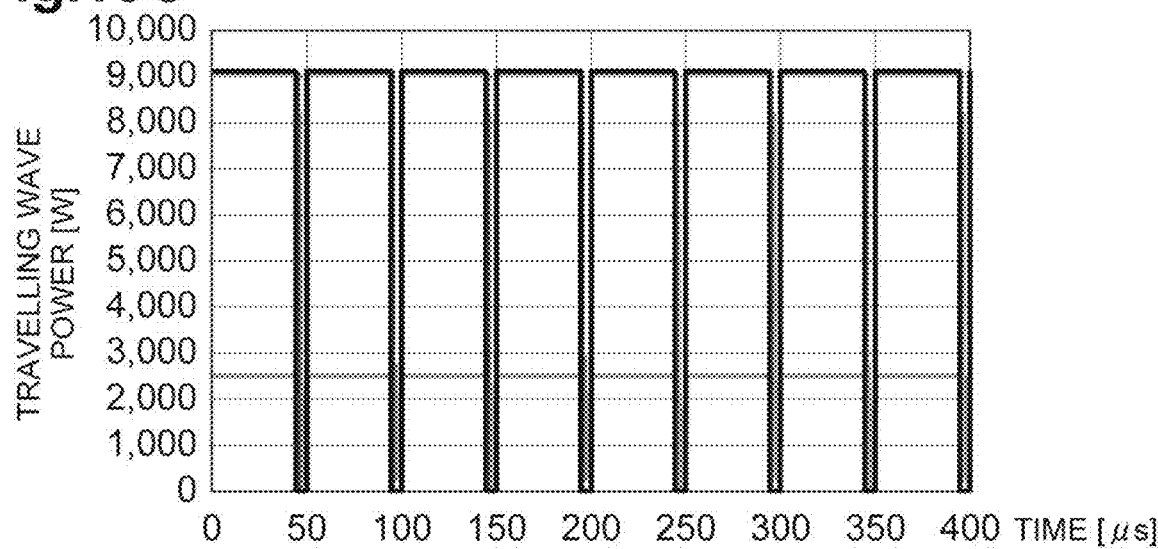

FIGS. 19A to 19C are graphs illustrating results of simulating a relationship between traveling wave power and time every duty ratio in Example 4 (a microwave alternately having a broadband frequency and a single frequency peak). FIG. 19A illustrates a waveform at a duty ratio of 10%. FIG. 19B illustrates a waveform at a duty ratio of 50%. FIG. 19C illustrates a waveform at a duty ratio of 90%. A rectangular signal illustrated in each of FIGS. 19A to 19C is the synchronization signal PSS-M. As illustrated in FIGS. 19A to 19C, in a case where the microwave alternately having a broadband frequency and a single frequency peak was pulse-modulated, it was checked that a high section and a low section can be clearly differentiated from each other regardless of a setting duty ratio. In Example 4, compared with Comparison Example 3, it was checked that a pulse frequency and a duty ratio of a pulse-modulated microwave are easily monitored.

Measurement Errors

A relationship between a measurement error and the number of times of determination in the measurement control unit was simulated.

Comparative Example 4

Comparative Example 4 corresponds to a waveform obtained by pulse-modulating a microwave having a broadband frequency. The microwave was detected, and measurement errors were checked. The frequency accuracy was calculated by using Equation (1). The duty ratio error was calculated by using Equation (2). The maximum error was calculated on the basis of the frequency accuracy and the duty ratio error. Simulation conditions are as follows.
High level setting power: 2500 W
High level waveform: BB waveform
Low level setting power: 1000 W
Low level waveform: BB waveform
Setting frequency: 2460 MHz
Setting pulse frequency: 20 kHz
Setting duty ratio: 50%
First upper limit threshold value, and first lower limit threshold value: 2500 W+10 W, and 2500 W−10 W
Second upper limit threshold value, and second lower limit threshold value: 1000 W+10 W, and 1000 W−10 W
Movement average time: 0 to 7 μs
Number of times of determination: one to four
Simulation results are illustrated in FIGS. 20A to 20C.

Hereinafter, a description will be made of determination of a high level and a low level of power using the number of times of determination. In the data Pf(t) of traveling wave power in FIG. 7, in a case where Pf(t) consecutively stays by the number of times of determination between the first upper limit threshold value and the first lower limit threshold value, it is determined that the traveling wave power has a high level. In other words, in a case where the number of times of determination is one, when the first upper limit threshold value≥Pf(t)≥the first lower limit threshold value is satisfied, it is determined that the traveling wave power has a high level. In a case where the number of times of determination is three, when the first upper limit threshold value≥Pf(t), Pf(t−1), and Pf(t−2)≥the first lower limit threshold value is satisfied, it is determined that the traveling wave power has a high level. In a case where it is determined once that the traveling wave power has a high level, the traveling wave power is still determined as having a high level until it is determined that the traveling wave power has a low level even if Pf(t) is deviated between the first upper limit threshold value and the first lower limit threshold value. In the data Pf(t) of traveling wave power in FIG. 7, in a case where Pf(t) consecutively stays by the number of times of determination between the second upper limit threshold value and the second lower limit threshold value, it is determined that the traveling wave power has a low level. In other words, in a case where the number of times of determination is one, when the second upper limit threshold value≥Pf(t)≥the second lower limit threshold value is satisfied, it is determined that the traveling wave power has a low level. In a case where the number of times of determination is three, when the second upper limit threshold value≥Pf(t), Pf(t−1), and Pf(t−2)≥the second lower limit threshold value is satisfied, it is determined that the traveling wave power has a low level. In a case where it is determined once that the traveling wave power has a low level, the traveling wave power is still determined as having a low level until it is determined that the traveling wave power has a high level even if Pf(t) is deviated between the second upper limit threshold value and the second lower limit threshold value.

Figure 20A:
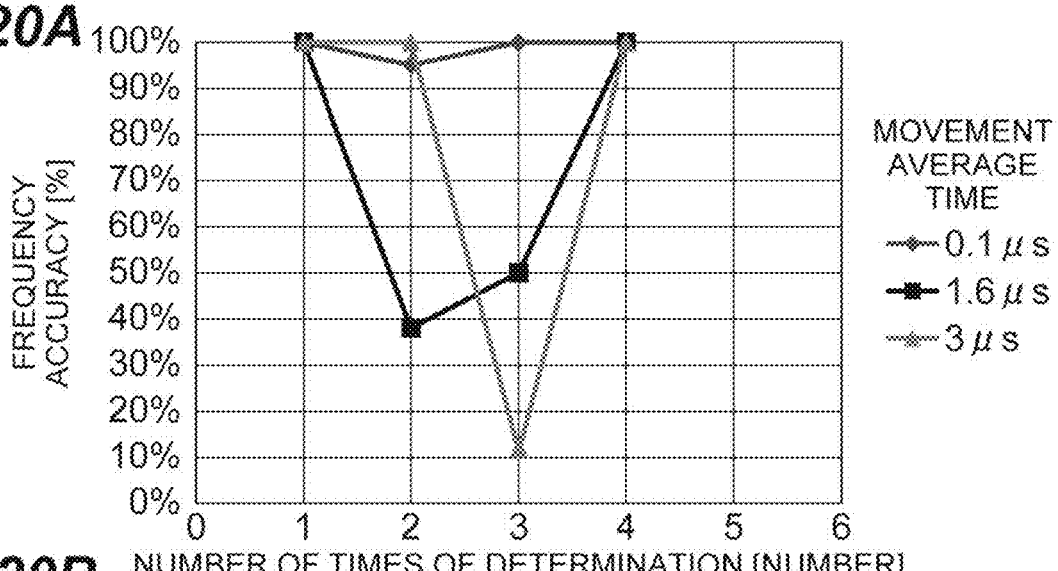
FIGS. 20A to 20C are graphs illustrating results of simulating pulse monitor accuracy in Comparative Example 4 (a microwave having a broadband frequency).
Figure 20B:
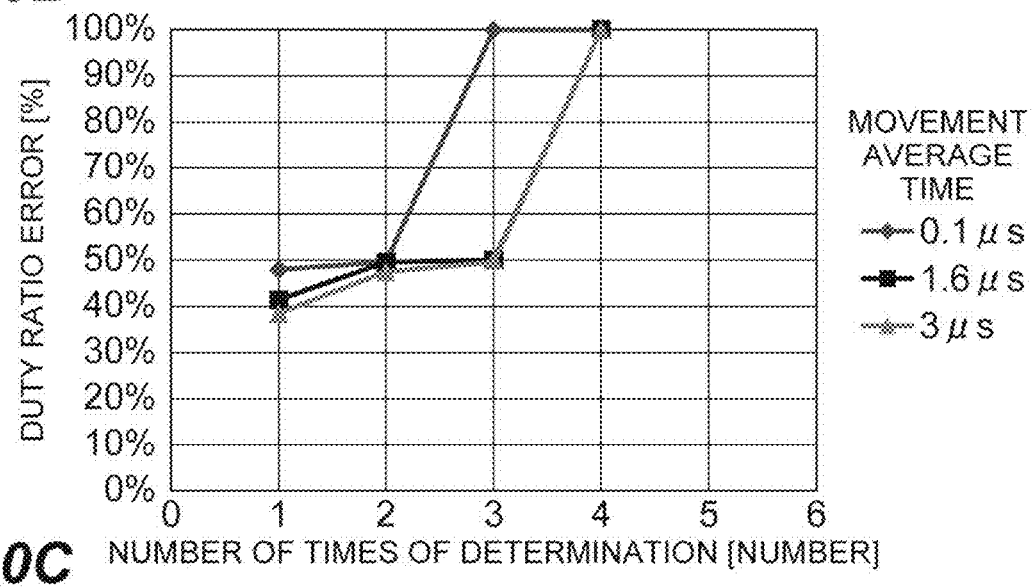
Figure 20C:
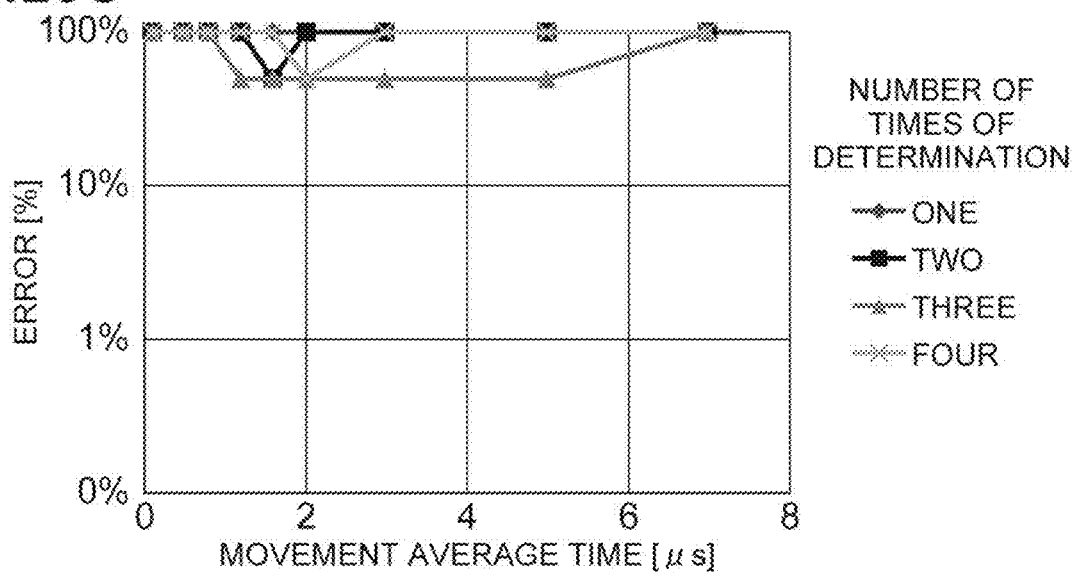

FIGS. 20A to 20C are graphs illustrating results of simulating pulse monitor accuracy in Comparative Example 4 (a microwave having a broadband frequency). FIG. 20A illustrates a result of calculating a relationship between the number of times of determination and frequency accuracy every movement average time. FIG. 20B illustrates a result of calculating a relationship between the number of times of determination and a duty ratio error every movement average time. FIG. 20C illustrates a result of calculating a relationship between a movement average time and an error (maximum error) every number of times of determination. As illustrated in FIGS. 20A to 20C, in measurement of a microwave having a broadband frequency, it was checked that it is hard to obtain sufficient accuracy (for example, 3% or less) even if the number of times of determination and a movement average time are changed.

Example 5

Example 5 corresponds to a pulse-modulated waveform in which a microwave having a broadband frequency and a microwave having a single frequency peak alternately appear. The microwave was detected, and measurement errors were checked. The frequency accuracy was calculated by using Equation (1). The duty ratio error was calculated by using Equation (2). The maximum error was calculated on the basis of the frequency accuracy and the duty ratio error. Simulation conditions are as follows.

Low level waveform: SP waveform

Other conditions are the same as those in Comparison Example 4. Simulation results are illustrated in FIGS. 21A to 21C.

FIGS. 21A to 21C are graphs illustrating results of simulating pulse monitor accuracy in Example 5 (a microwave alternately having a broadband frequency and a single frequency peak). FIG. 21A illustrates a result of calculating a relationship between the number of times of determination and frequency accuracy every movement average time. FIG. 21B illustrates a result of calculating a relationship between the number of times of determination and a duty ratio error every movement average time. FIG. 21C illustrates a result of calculating a relationship between a movement average time and an error (maximum error) every number of times of determination. As illustrated in FIGS. 21A to 21C, in measurement of a microwave alternately having a broadband frequency and a single frequency peak, it was checked that, as the number of times of determination is increased, and a movement average time is reduced, the accuracy tends to be improved. It was checked that sufficient accuracy (for example, 3% or less) is obtained by appropriately selecting the number of times of determination and a movement average time. For example, it was checked, in a case where a movement average time is set to 1.2 μs, and the number of times of determination is set to three or more, an error of 3% or less can be realized.

Example 6

Example 6 corresponds to a pulse-modulated waveform in which a microwave having a broadband frequency and a microwave having a single frequency peak alternately appear. The microwave was detected, and measurement errors were checked. The frequency accuracy was calculated by using Equation (1). The duty ratio error was calculated by using Equation (2). The maximum error was calculated on the basis of the frequency accuracy and the duty ratio error. Simulation conditions are as follows.

High level waveform: SP waveform

Other conditions are the same as those in Comparison Example 4. Simulation results are illustrated in FIGS. 22A to 22C.

Figure 22A:
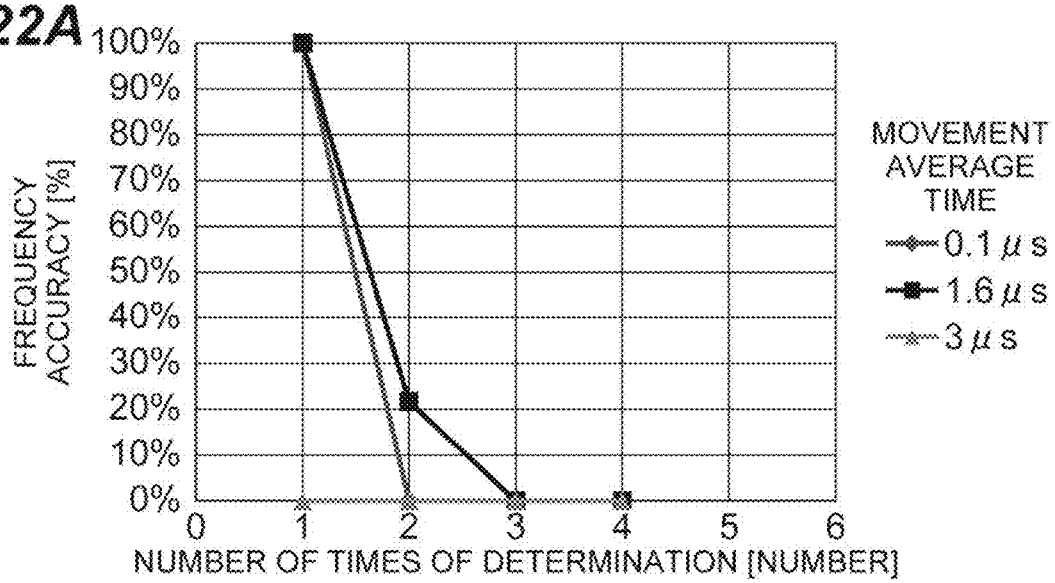
FIGS. 22A to 22C are graphs illustrating results of simulating pulse monitor accuracy in Example 6 (a microwave alternately having a broadband frequency and a single frequency peak).
Figure 22B:
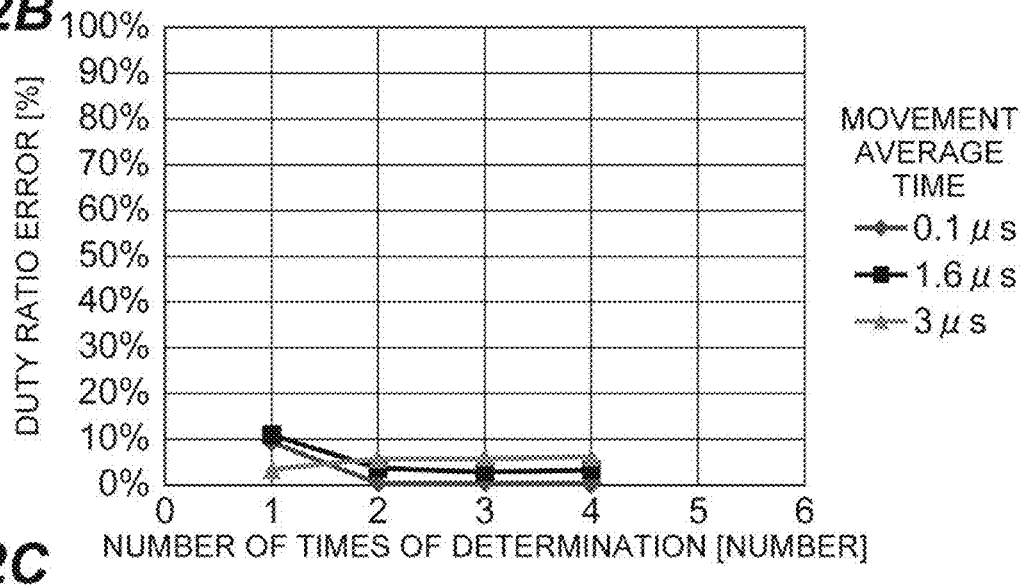
Figure 22C:
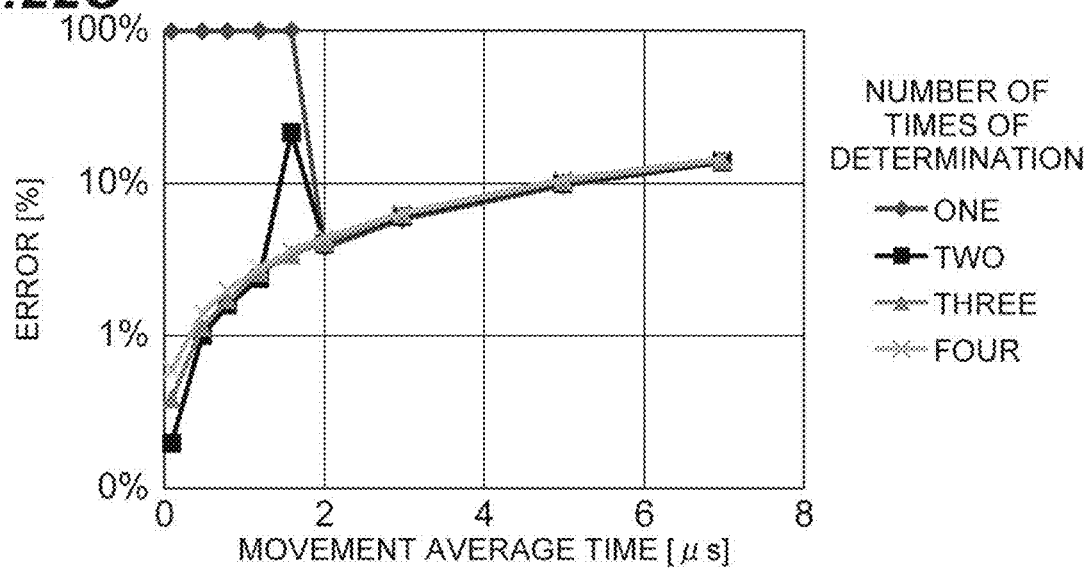

FIGS. 22A to 22C are graphs illustrating results of simulating pulse monitor accuracy in Example 6 (a microwave alternately having a broadband frequency and a single frequency peak). FIG. 22A illustrates a result of calculating a relationship between the number of times of determination and frequency accuracy every movement average time. FIG. 22B illustrates a result of calculating a relationship between the number of times of determination and a duty ratio error every movement average time. FIG. 22C illustrates a result of calculating a relationship between a movement average time and an error (maximum error) every number of times of determination. As illustrated in FIGS. 22A to 22C, it was checked that, as the number of times of determination is increased, and a movement average time is reduced, the accuracy tends to be improved. It was checked that sufficient accuracy (for example, 3% or less) is obtained by appropriately selecting the number of times of determination and a movement average time. For example, it was checked, in a case where a movement average time is set to 1.2 μs, and the number of times of determination is set to three or more, an error of 3% or less can be realized.

What is claimed is:
1. A microwave output device comprising:
a microwave generation unit configured to generate a microwave, power of the microwave being pulse-modulated such that a pulse frequency, a duty ratio, a high level, and a low level respectively corresponding to a setting pulse frequency, a setting duty ratio, high level setting power, and low level setting power given from a controller; and an output unit configured to output a microwave propagating from the microwave generation unit, wherein the microwave generation unit alternately generates a microwave having a center frequency and a bandwidth respectively corresponding to a setting frequency and a setting bandwidth given from the controller and a microwave having a single frequency peak at a center frequency corresponding to a setting frequency given from the controller, in synchronization with switching between a high level and a low level of the power of the microwave.

2. The microwave output device according to claim 1, wherein the microwave generation unit alternately generates a microwave having a center frequency and a bandwidth and a microwave having a single frequency peak at the center frequency in synchronization with switching between a high level and a low level of the power in a case where the low level setting power is higher than threshold power, and generates a microwave having a center frequency and a bandwidth and being pulse-modulated in a case where the low level setting power is equal to or lower than the threshold power.

3. The microwave output device according to claim 2, wherein the low level setting power is 0 W.

4. The microwave output device according to claim 1, wherein the microwave generation unit generates a waveform of a microwave in which a first waveform having a center frequency and a bandwidth respectively corresponding to a setting frequency and a setting bandwidth given from the controller and a second waveform having a single frequency peak at a center frequency corresponding to a setting frequency given from the controller alternately appear, on the basis of a pulse synchronization signal, and controls power of the first waveform and power of the second waveform on the basis of the generated waveform of the microwave, the pulse synchronization signal, and setting power corresponding to each of the first waveform and the second waveform.

5. The microwave output device according to claim 2, wherein the microwave generation unit generates a waveform of a microwave in which a first waveform having a center frequency and a bandwidth respectively corresponding to a setting frequency and a setting bandwidth given from the controller and a second waveform having a single frequency peak at a center frequency corresponding to a setting frequency given from the controller alternately appear, on the basis of a pulse synchronization signal, and controls power of the first waveform and power of the second waveform on the basis of the generated waveform of the microwave, the pulse synchronization signal, and setting power corresponding to each of the first waveform and the second waveform.

6. The microwave output device according to claim 3, wherein the microwave generation unit generates a waveform of a microwave in which a first waveform having a center frequency and a bandwidth respectively corresponding to a setting frequency and a setting bandwidth given from the controller and a second waveform having a single frequency peak at a center frequency corresponding to a setting frequency given from the controller alternately appear, on the basis of a pulse synchronization signal, and controls power of the first waveform and power of the second waveform on the basis of the generated waveform of the microwave, the pulse synchronization signal, and setting power corresponding to each of the first waveform and the second waveform.

7. The microwave output device according to claim 1, further comprising:

a first directional coupler configured to output parts of travelling waves propagating from the microwave generation unit to the output unit; and a measurement unit configured to determine a first high measured value and a first low measured value respectively indicating a high level and a low level of power of a travelling wave at the output unit on the basis of the parts of the travelling waves output from the first directional coupler, wherein the measurement unit averages the first high measured value and the first low measured value with a predetermined movement average time and a predetermined sampling interval, and wherein the microwave generation unit controls high level power of the pulse-modulated microwave on the basis of the averaged first high measured value and the high level setting power, and controls low level power of the pulse-modulated microwave on the basis of the averaged first low measured value and the low level setting power.

8. The microwave output device according to claim 2, further comprising:

a first directional coupler configured to output parts of travelling waves propagating from the microwave generation unit to the output unit; and a measurement unit configured to determine a first high measured value and a first low measured value respectively indicating a high level and a low level of power of a travelling wave at the output unit on the basis of the parts of the travelling waves output from the first directional coupler, wherein the measurement unit averages the first high measured value and the first low measured value with a predetermined movement average time and a predetermined sampling interval, and wherein the microwave generation unit controls high level power of the pulse-modulated microwave on the basis of the averaged first high measured value and the high level setting power, and controls low level power of the pulse-modulated microwave on the basis of the averaged first low measured value and the low level setting power.

9. The microwave output device according to claim 3, further comprising:

a first directional coupler configured to output parts of travelling waves propagating from the microwave generation unit to the output unit; and a measurement unit configured to determine a first high measured value and a first low measured value respectively indicating a high level and a low level of power of a travelling wave at the output unit on the basis of the parts of the travelling waves output from the first directional coupler, wherein the measurement unit averages the first high measured value and the first low measured value with a predetermined movement average time and a predetermined sampling interval, and wherein the microwave generation unit
controls high level power of the pulse-modulated microwave on the basis of the averaged first high measured value and the high level setting power, and
controls low level power of the pulse-modulated microwave on the basis of the averaged first low measured value and the low level setting power.

10. The microwave output device according to claim 4, further comprising:
a first directional coupler configured to output parts of travelling waves propagating from the microwave generation unit to the output unit; and
a measurement unit configured to determine a first high measured value and a first low measured value respectively indicating a high level and a low level of power of a travelling wave at the output unit on the basis of the parts of the travelling waves output from the first directional coupler,
wherein the measurement unit averages the first high measured value and the first low measured value with a predetermined movement average time and a predetermined sampling interval, and
wherein the microwave generation unit
controls high level power of the pulse-modulated microwave on the basis of the averaged first high measured value and the high level setting power, and
controls low level power of the pulse-modulated microwave on the basis of the averaged first low measured value and the low level setting power.

11. The microwave output device according to claim 7, further comprising:
a second directional coupler configured to output parts of reflected waves returned to the output unit,
wherein the measurement unit further determines a second high measured value and a second low measured value respectively indicating a high level and a low level of power of a reflected wave at the output unit on the basis of the parts of the reflected waves output from the second directional coupler, and averages the second high measured value and the second low measured value with a predetermined movement average time and a predetermined sampling interval, and
wherein the microwave generation unit
controls high level power of the pulse-modulated microwave on the basis of the averaged first high measured value, the averaged second high measured value, and the high level setting power, and
controls low level power of the pulse-modulated microwave on the basis of the averaged first low measured value, the averaged second low measured value, and the low level setting power.

12. The microwave output device according to claim 8, further comprising:
a second directional coupler configured to output parts of reflected waves returned to the output unit,
wherein the measurement unit further determines a second high measured value and a second low measured value respectively indicating a high level and a low level of power of a reflected wave at the output unit on the basis of the parts of the reflected waves output from the second directional coupler, and averages the second high measured value and the second low measured value with a predetermined movement average time and a predetermined sampling interval, and wherein the microwave generation unit
controls high level power of the pulse-modulated microwave on the basis of the averaged first high measured value, the averaged second high measured value, and the high level setting power, and
controls low level power of the pulse-modulated microwave on the basis of the averaged first low measured value, the averaged second low measured value, and the low level setting power.

13. The microwave output device according to claim 9, further comprising:
a second directional coupler configured to output parts of reflected waves returned to the output unit,
wherein the measurement unit further determines a second high measured value and a second low measured value respectively indicating a high level and a low level of power of a reflected wave at the output unit on the basis of the parts of the reflected waves output from the second directional coupler, and averages the second high measured value and the second low measured value with a predetermined movement average time and a predetermined sampling interval, and
wherein the microwave generation unit
controls high level power of the pulse-modulated microwave on the basis of the averaged first high measured value, the averaged second high measured value, and the high level setting power, and
controls low level power of the pulse-modulated microwave on the basis of the averaged first low measured value, the averaged second low measured value, and the low level setting power.

14. The microwave output device according to claim 10, further comprising:
a second directional coupler configured to output parts of reflected waves returned to the output unit,
wherein the measurement unit further determines a second high measured value and a second low measured value respectively indicating a high level and a low level of power of a reflected wave at the output unit on the basis of the parts of the reflected waves output from the second directional coupler, and averages the second high measured value and the second low measured value with a predetermined movement average time and a predetermined sampling interval, and
wherein the microwave generation unit
controls high level power of the pulse-modulated microwave on the basis of the averaged first high measured value, the averaged second high measured value, and the high level setting power, and
controls low level power of the pulse-modulated microwave on the basis of the averaged first low measured value, the averaged second low measured value, and the low level setting power.

15. A plasma processing apparatus comprising:
a chamber main body; and
the microwave output device configured to output a microwave for exciting a gas to be supplied to the chamber main body,
wherein the microwave output device including:
a microwave generation unit configured to generate a microwave, power of the microwave being pulse-modulated such that a pulse frequency, a duty ratio, a high level, and a low level respectively corresponding to a setting pulse frequency, a setting duty ratio, high level setting power, and low level setting power given from a controller; and
an output unit configured to output a microwave propagating from the microwave generation unit, wherein the microwave generation unit alternately generates a microwave having a center frequency and a bandwidth respectively corresponding to a setting frequency and a setting bandwidth given from the controller and a microwave having a single frequency peak at a center frequency corresponding to a setting frequency given from the controller, in synchronization with switching between a high level and a low level of the power of the microwave.

16. The microwave output device according to claim 15, wherein the microwave generation unit
   alternately generates a microwave having a center frequency and a bandwidth and a microwave having a single frequency peak at the center frequency in synchronization with switching between a high level and a low level of the power in a case where the low level setting power is higher than threshold power, and
   generates a microwave having a center frequency and a bandwidth and being pulse-modulated in a case where the low level setting power is equal to or lower than the threshold power.

17. The microwave output device according to claim 16, wherein the low level setting power is 0 W.

18. The microwave output device according to claim 15, wherein the microwave generation unit
   generates a waveform of a microwave in which a first waveform having a center frequency and a bandwidth respectively corresponding to a setting frequency and a setting bandwidth given from the controller and a second waveform having a single frequency peak at a center frequency corresponding to a setting frequency given from the controller alternately appear, on the basis of a pulse synchronization signal, and
   controls power of the first waveform and power of the second waveform on the basis of the generated waveform of the microwave, the pulse synchronization signal, and setting power corresponding to each of the first waveform and the second waveform.

19. The microwave output device according to claim 15, further comprising:
   a first directional coupler configured to output parts of travelling waves propagating from the microwave generation unit to the output unit; and
   a measurement unit configured to determine a first high measured value and a first low measured value respectively indicating a high level and a low level of power of a travelling wave at the output unit on the basis of the parts of the travelling waves output from the first directional coupler,
   wherein the measurement unit averages the first high measured value and the first low measured value with a predetermined movement average time and a predetermined sampling interval, and
   wherein the microwave generation unit
      controls high level power of the pulse-modulated microwave on the basis of the averaged first high measured value and the high level setting power, and
      controls low level power of the pulse-modulated microwave on the basis of the averaged first low measured value and the low level setting power.

20. The microwave output device according to claim 19, further comprising:
   a second directional coupler configured to output parts of reflected waves returned to the output unit,
   wherein the measurement unit further determines a second high measured value and a second low measured value respectively indicating a high level and a low level of power of a reflected wave at the output unit on the basis of the parts of the reflected waves output from the second directional coupler, and averages the second high measured value and the second low measured value with a predetermined movement average time and a predetermined sampling interval, and
   wherein the microwave generation unit
      controls high level power of the pulse-modulated microwave on the basis of the averaged first high measured value, the averaged second high measured value, and the high level setting power, and
      controls low level power of the pulse-modulated microwave on the basis of the averaged first low measured value, the averaged second low measured value, and the low level setting power.

* * * * *